United States Patent
Alexander et al.

(10) Patent No.: US 6,307,895 B1
(45) Date of Patent: *Oct. 23, 2001

(54) COMPLEX FOURIER COEFFICIENT EXTRACTOR

(75) Inventors: Edward Alexander, Falls Church, VA (US); Anthony Spezio, Laurel, MD (US); Hal Levitt, Baltimore, MD (US); Brian Krantz, Gaithersburg, MD (US)

(73) Assignee: The United States of America as represented by the Secretary of the Navy, Washington, DC (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/052,676

(22) Filed: Apr. 1, 1998

(51) Int. Cl.[7] .................................................... H03K 9/00
(52) U.S. Cl. ........................ 375/316; 375/130; 359/305; 356/450; 324/76.37
(58) Field of Search ............................. 324/76.37, 76.36; 375/130, 140, 316; 356/303, 450; 342/192; 359/191, 305, 310

(56) References Cited

U.S. PATENT DOCUMENTS

| | | |
|---|---|---|
| 4,225,938 | 9/1980 | Turpin .................................. 708/816 |
| 4,365,310 | 12/1982 | Green ................................... 708/816 |
| 4,414,583 | 11/1983 | Hooker, III .......................... 358/300 |
| 4,467,276 | 8/1984 | Marten et al. ..................... 324/76.37 |
| 4,558,925 | 12/1985 | Casseday et al. ...................... 359/306 |
| 4,644,267 * | 2/1987 | Tsui et al. .......................... 324/76.37 |
| 4,696,061 * | 9/1987 | Labrum ................................ 359/162 |
| 4,699,513 | 10/1987 | Brooks et al. ........................ 356/345 |
| 4,725,774 * | 2/1988 | Davis et al. ....................... 324/76.36 |
| 4,735,476 | 4/1988 | Heffner et al. ........................... 385/7 |
| 4,802,149 | 1/1989 | Moore .................................. 367/100 |
| 4,909,627 | 3/1990 | Brousseau ............................ 356/346 |
| 4,951,061 * | 8/1990 | Lee ...................................... 342/373 |
| 4,962,382 * | 10/1990 | Lee ...................................... 342/372 |
| 5,090,795 | 2/1992 | O'Meara et al. .................... 359/240 |
| 5,267,188 * | 11/1993 | Pape et al. ........................... 708/821 |
| 5,327,142 * | 7/1994 | Tsui et al. ............................ 342/192 |
| 5,682,238 | 10/1997 | Levitt et al. ......................... 356/345 |
| 5,923,460 * | 7/1999 | Stewart et al. ....................... 359/305 |
| 6,061,135 * | 5/2000 | Levitt et al. ......................... 356/354 |

* cited by examiner

*Primary Examiner*—Stephen Chin
*Assistant Examiner*—Chieh M. Fan
(74) *Attorney, Agent, or Firm*—John J. Karasek; L. George Legg

(57) ABSTRACT

A system for extracting the complex Fourier coefficients from an unknown RF signal to classify the RF signal is disclosed. The extraction system utilizes optical signal processing in combination with the generation of electronic timing and control signals. The system employs an optical processor comprising a Bragg cell to yield the Fourier coefficients including the amplitude, phase and frequency parameters thereof. The system further includes a parallel arrangement that provide for parallel processing to reduce the computational time needed to determine the complex Fourier coefficients including the amplitude, phase and frequency parameters thereof.

11 Claims, 14 Drawing Sheets

COMPLEX FOURIER COEFFICIENT EXTRACTOR

BACKGROUND OF THE INVENTION

1. Field of the Invention

The present invention relates to a system that performs the measurement of complex Fourier coefficients of RF signals. More particularly, the present invention relates to a system that performs complex Fourier coefficient measurements of RF signals using optical processing techniques, specifically, a technique that improves on the Bragg cell optical technique so as to yield the phase parameters along with the frequency coefficient amplitude parameters of the RF signals being characterized.

2. Description of the Prior Art

Digital signal processing techniques are currently employed to provide complex Fourier coefficient measurements of RF signals so as to classify such RF signals. The digital signal processing techniques begin with the digitizing of the RF signal and then electronically calculating the Fourier transform which, in turn, yields the Fourier coefficients. The existing techniques that calculate complex Fourier coefficients take in the order of 300 microseconds which is relatively slow for many applications and are especially slow for dense signal environments made up of many RF signals. It is desired that the measurement of the Fourier coefficient be accomplished by faster means than digital signal processing techniques, more particularly, by optical processing techniques based on Bragg cell spectrum analysis techniques.

OBJECTS OF THE INVENTION

It is a primary object of the present invention to provide an electronic/optical hybrid system that provides complex spectrum analysis of the signal modulation that yields Fourier coefficients and which builds on known Bragg cell spectrum analysis techniques.

It is another object of the present invention to provide for optical processing techniques that yield the determination of the Fourier coefficients, especially the phase parameter thereof.

It is another object of the present invention to provide for a system that yields the determination of complex Fourier coefficients, especially the phase parameter, with minimum processing time by employing speed of light and parallel signal processing techniques.

Further still, it is an object of the present invention to provide for various embodiments of optical processing techniques each yielding the accurate determination of the Fourier coefficients, including the phase parameter thereof.

Further, it is an object of the present invention to reduce, in certain cases, the amount of sampling of an unknown RF signal that is needed to determine the Fourier coefficients, for example, when the intensity of the unknown RF signal is a known quantity.

SUMMARY OF THE INVENTION

The present invention is directed to an apparatus for extracting Fourier coefficients from an RF signal of interest so as to characterize the RF signal. The RF signal has a fundamental frequency and harmonics thereof along with a leading edge and a carrier frequency which is modulated. The apparatus is adapted to permit interference between beams of the same frequency launched from two different Bragg cells and preferably extracts the Fourier coefficient by using parallel and optical processing techniques so as to provide a rapid determination thereof.

The apparatus comprises a generator, first and second Bragg cells, and means for receiving the outputs of the Bragg cells. The generator generates a signal having a predetermined spectrum that includes one of the fundamental and harmonic frequencies of the RF signal of interest. The first Bragg cell has means for receiving the RF signal and providing a representative output thereof. The second Bragg cell has means for receiving the signal generated by the generator and providing a representative output thereof. The means for receiving the outputs of the first and second Bragg cells allows for the outputs of the Bragg cells to interact with each other to produce an interference pattern that contains amplitude and relative phase information representative of the Fourier coefficients of the RF signal of interest. In one embodiment, the generator provides a frequency spectrum containing a frequency that corresponds to one of the fundamental and harmonic frequencies of the RF signal of interest.

BRIEF DESCRIPTION OF THE DRAWINGS

These and other objects, features and advantages of the invention, as well as the invention itself, become better understood by reference to the following detailed description when considered in conjunction with the accompanying drawings wherein like reference numbers designate identical or corresponding parts throughout and wherein.

DETAILED DESCRIPTION OF THE PREFERRED EMBODIMENTS

Figure 1:
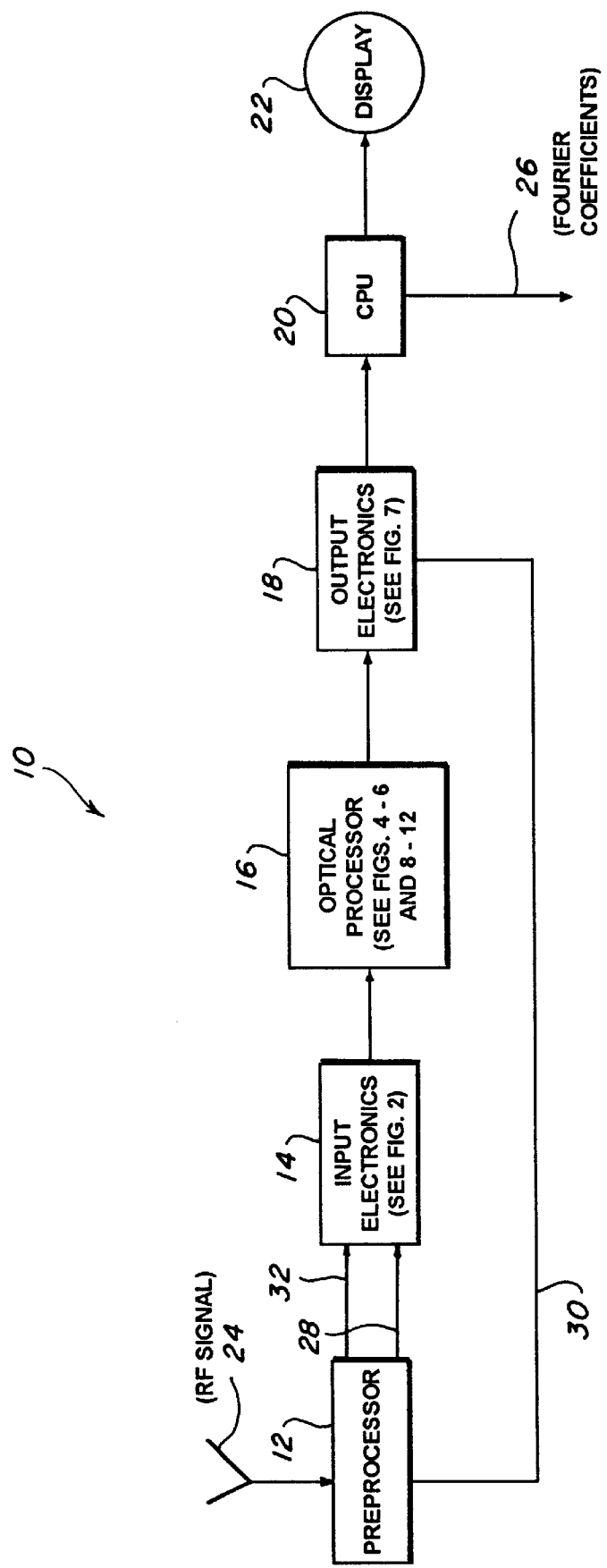
FIG. 1 is a block diagram of the system of the present invention for extracting Fourier coefficients from RF signals.

Referring to the drawings, there is shown in FIG. 1 a system 10 for extracting complex Fourier coefficients of an RF signal of interest so as to characterize the RF signal. The system 10 for extracting the complex Fourier coefficients comprises a preprocessor 12, input electronics 14, an optical processor 16, output electronics 18, a central processing unit (CPU) 20, and preferably a display 22. The system 10 accepts input pulsed RF signals 24 and outputs the complex Fourier coefficients 26 of the modulation embodied in the RF signal 24. The RF signal 24 has a fundamental frequency and harmonics thereof and a leading edge and a carrier frequency which is modulated. The RF signal 24 is applied to the preprocessor 12.

The preprocessor 12 serves as means for receiving the RF signal 24 having the leading edge. The preprocessor 12, in a manner known in the art, generates first and second timing signals on signal paths 28 and 30, respectively routed to input electronics 14 and output electronics 18, in response to the leading edge of the respective RF signal 24. The preprocessor 12 downconverts and demodulates the RF signal 24 to a baseband so as to remove the carrier frequency, but leave the modulation. This demodulated baseband signal serves as the output of the preprocessor 12 and is routed, via signal path 32, to the input electronics 14 which may be further described with reference to FIG. 2.

The input electronics 14 serves as the means for generating the signal and reference waveforms to respectively excite the optical processor Bragg cell 34 having acoustic columns 36 and 38, to be further described with reference to FIG. 4. Although it is preferred that the input electronics 14 be used, other means may be provided so long as the generated signal and reference signals are developed in accordance with the teachings of the present invention.

The input electronics 14 preferably comprises first, second and third branches, with the first branch comprising means 40 for amplifying the modulation signal on signal path 32 and means 42 which is a time delay (τ) that delays the received signal by a predetermined amount, to be further described hereinafter. The first branch further comprises a mixer 44 having first and second inputs and an output on signal path 46 that provides the signal to acoustic column 36 of the Bragg cell 34. The first input of mixer 44 is connected to the output of time delay 42.

The second branch of the input electronics 14 comprises an oscillator 48 having an output that is routed to a pseudorandom noise (PRN) generator 50. The PRN output is routed to mixer 52. The oscillator 48 provides a signal with an exemplary frequency of 155 MHz. The mixer 52 also has an output applied to signal path 54 that supplies the reference signal to acoustic column 38 of the Bragg cell 34. The mixer 52 has first and second inputs with the first input connected to the output of the PRN generator 50. The PRN generator 50 provides a signal whose Fourier transform outputs, serving as spectral components, are at evenly spaced intervals representative of a comb spectrum that has a typical comb distribution of 5, 10 . . . 40 MHz.

The third branch of the input electronics 14 comprises a local oscillator 56 having two outputs with the first output connected to the second input of the mixer 44 and the second output connected to the input of the mixer 52. The oscillator 56 provides an output signal having a typical frequency of 120 MHz.

The input electronics 14 receives the baseband, downconverted, demodulated signal on signal path 32, and after a delay provided by time delay 42, the received signal is upconverted by the interaction of the signal applied to mixer 44, via time delay 42, and the output signal of the local oscillator 56. This upconverted RF signal, via signal path 46, is applied to the signal Bragg cell acoustic column 36 of the Bragg cell 34. The input electronics 14 has a mixer 52 which has as inputs: the PRN generator 50 and the output of local oscillator 56. The output of mixer 52 provides the reference waveform applied to the acoustic column 38. The PRN signal on signal path 54 is converted to a Bragg cell frequency (established by local oscillator 56) by the operation of mixer 52 and applied to the reference Bragg cell acoustic column 38. The overall operation of the oscillator 48 and the PRN generator 50 are both responsive to the first timing signal on signal path 28. More particularly, the first timing signal on signal path 28 activates and synchronizes the operations of the oscillator 48 and the PRN generator 50.

The PRN generator 50 outputs a PRN code at a sub harmonic rate that is established by the oscillator 48. The PRN code mixes with the Bragg cell local oscillator, that is, local oscillator 56. The modulated carrier on signal path 54 drives the reference Bragg cell, that is, the acoustic column 38. The baseband, downconverted, demodulated signal on signal path 32 passes through the delay line 42 which equalizes the timing in the signal and reference paths, that is, the first and second branches of the input electronics 14 and provides a baseband signal. The baseband signal at the output of the time delay 42 mixes with the Bragg cell local oscillator 56 and provides the upconverted baseband signal on path 46 to drive the signal Bragg cell, that is, the acoustic column 36 of the Bragg cell 34.

The present invention utilizes an optical processor Fourier analyzer to determine the signal modulation spectral characteristics, that is, the RF signal 24 of FIG. 1. The present invention computes both the amplitude and the phase parameters of the complex Fourier coefficients.

Figure 3:
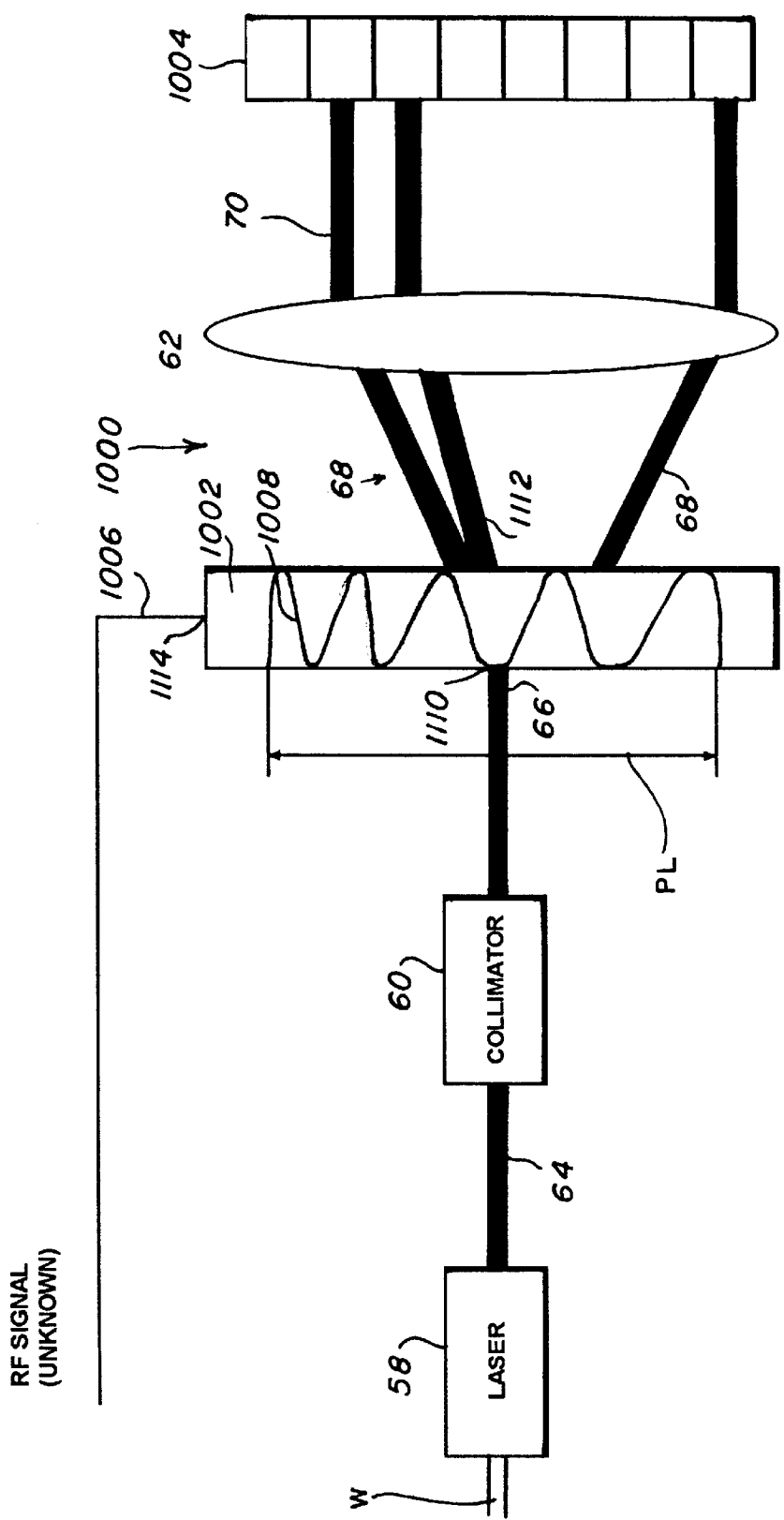
FIG. 3 is a diagram of a prior art device employing Bragg cell technology Fourier analysis but without the benefits of the present invention.

FIG. 3 illustrates a prior art arrangement 1000 comprised of a Bragg cell 1002 containing a linear and exemplary frequency chirp 1008, a linear photodetector array 1004, a signal path 1006 that carries a RF signal, similar to the RF signal 24 of FIG. 1, to be analyzed by the circuit arrangement of FIG. 3 so as to produce an acoustic response 1008 having a pulse length PL as shown in FIG. 3. Bragg cells, as well as Fourier lenses, are well known in the art and are disclosed, for example, in U.S. Pat. Nos. 4,558,925; 4,725,774 and 4,802,149 all of which are herein incorporated by reference and reference thereto for a general discussion thereof may be found.

The arrangement 1000 also comprises a laser 58 having a light source beam width, W, shown in FIG. 3, and a collimator 60, both also applicable to the present invention. The laser 58 provides a laser beam 64 which is received by the collimator 60 which, in turn, provides for a collimated laser beam 66. The collimated laser beam 66 is applied to the input port 1110 of the Bragg cell 1002 which, in turn, develops signals at its output port 1112 shown in FIG. 3 as a pattern 68 of collimated beams diverging with respect to one another.

The pattern 68 is intercepted by a Fourier lens 62 that causes the intercepted pattern to be Fourier-transformed which, in turn, provides an output pattern 70 that impinges on the photodetector array 1004. The output pattern 70 is yielded by Fourier lens 62.

In operation, Bragg cell technology Fourier lens of FIG. 3, without the benefits of the present invention, analyzes signals, such as the RF signals on signal path 1006, by deflecting the input collimated light or laser beam 66 produced by laser 58 and collimator 60 at angles corresponding to the RF signal spectral content. More particularly, the angles correspond to the spectral content of the unknown RF signal on signal path 1006 and, similarly, the Bragg cell used in the present invention produces similar angles corresponding to the spectral content of the RF signal 24 of FIG. 1. The energy of unknown RF signal on signal path 1006 and that of RF signal 24 is spatially dispersed, in accordance with the corresponding angles, into different areas of each associated energy spectrum. The term "spatially dispersed" is interchangeably used herein with the term "demultiplexed." For the embodiment of FIG. 3, the light deflected at these angles is generally illustrated by diverging pattern 68. The Bragg cell 1002 has optical input (1110) and output (1112) ports and an electronic input port (1114). The electronic input port 1114 accepts the unknown RF signal on signal path 1006. The RF signal is applied to the Bragg cell electronic input port 1114. The Bragg cell 1002 upconverts the RF signal to optical frequencies in a manner more fully described in the previously mentioned U.S. Pat. Nos. 4,558,925; 4,725,774; and 4,802,149. The laser beam 66 having a width, W, enters the Bragg cell 1002 optical input port 1110. The Bragg cell 1002 has an interaction length, l, which is related to the interaction of the beam 66 (in particular W) and acoustic signal response 1008 (in particular PL) and which has a value (to be further described) which is the lesser of the two quantities W and PL both generally illustrated in FIG. 3. The Bragg cell 1002 analyzes the signal spectrum by optically deflecting portions (shown as pattern 68) of the incident collimated laser beam 66 through the output port 1112. The RF input signal is shown as a linear frequency chirp acoustic pattern 1008 as an example. The sine of the deflection angle varies linearly with the RF signal frequency of signal 1008. The deflected light intensity varies linearly with the spectral power in the input signal for low power RF signals.

The Fourier lens 62 focuses the angular spatially dispersed light onto a linear photodetector array 1004. The angular spatially dispersed light has a separate spatially distinct beam for each Fourier spectral component of the RF signal on signal path 1006 of FIG. 3, as well as the RF signal of FIG. 1, as is known in the art. The focus position along the array 1004 depends on the deflection angle, i.e., the RF signal frequency. The electrical strength of the linear photodetector array 1004 response included in beam pattern 70 indicates signal intensity, that is, the amplitude of the RF signal on signal path 1006. Two or more simultaneous input frequencies will correspondingly deflect two or more simultaneous output beams from the input laser beam 66. Each of the deflected beams (generally illustrated as diverging beam pattern 68) propagates at the same angle and intensity as if each beam of the deflected beams was acting independently. The signal spectrum is, therefore, immediately produced at the output focal plane of the Fourier lens 62, to be further described with reference to FIG. 5. However, this spectral analysis prior art method provides only the signal power (intensity) spectrum, not the phase, which is important to the present invention.

The spatially dispersed light beams related to the prior art arrangement 1000 of FIG. 3 comprising the diverging beam pattern 68 are frequency and phase modulated by the signal frequency component of the RF signal on signal path 1006. The frequency for a given spectral component can be recovered, in a manner known in the art, using a reference channel beam and a high bandwidth photodetector. The high bandwidth photodetector would produce an RF current (indicative of the amplitude of the RF signal on signal path 1006) by mixing the signal channel optical beam with a reference channel optical beam. In contrast, the phase information embodied in the unknown RF signal on signal path 1006 is difficult to recover because it is measured with respect to the phases of the other reference frequencies. The present invention recovers the phase information of the RF signal modulation and may be further described with reference to FIGS. 4 and 5, wherein FIG. 4 illustrates the arrangement of the optical processor 16 of FIG. 1, and FIG. 5 is composed of top and side projection illustrations of the optical outputs of the Bragg cell 34 and the Fourier lens 62 of the present invention.

Figure 2:
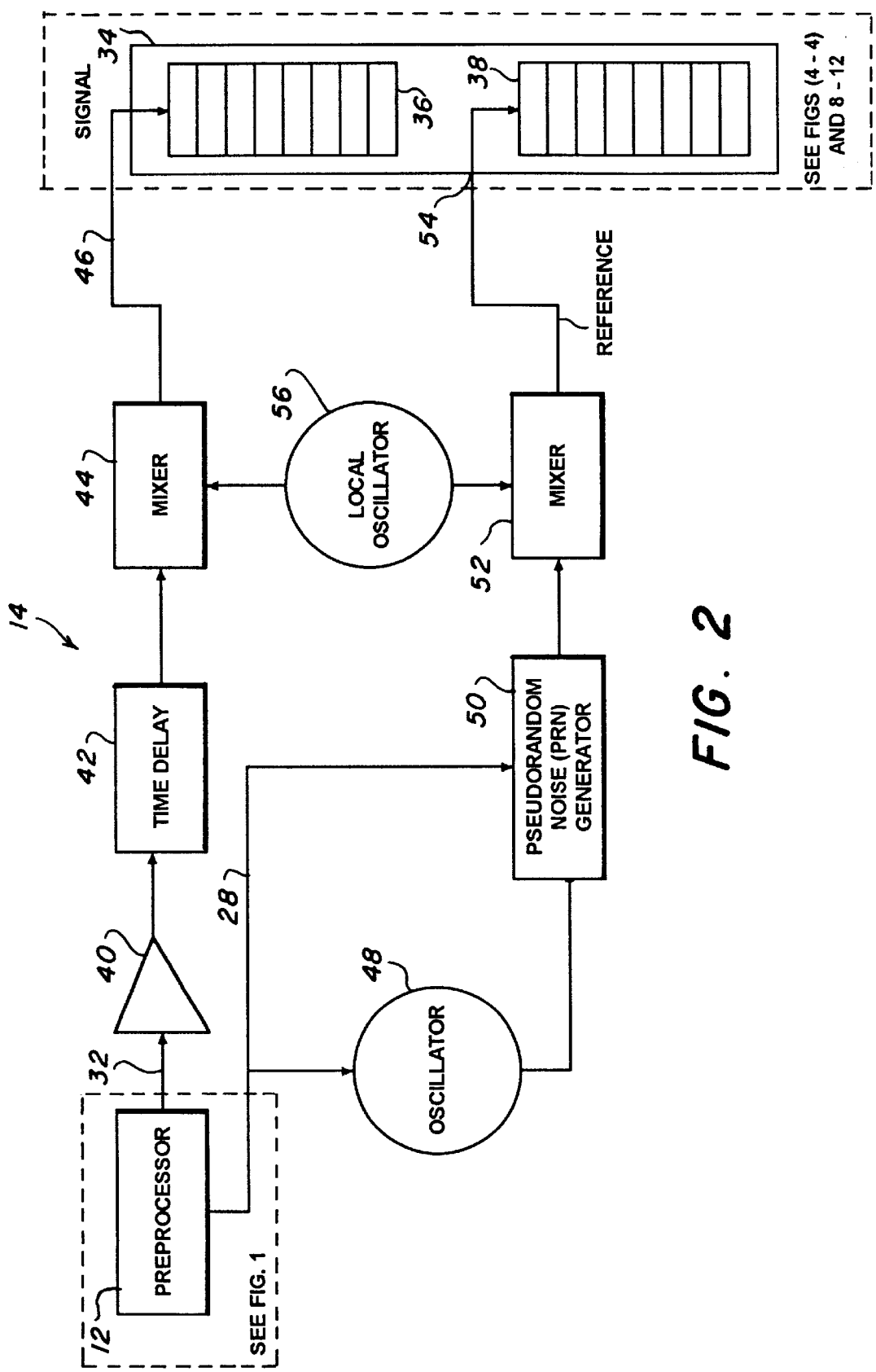
FIG. 2 is a block diagram of the input electronics of FIG. 1.
Figure 4:
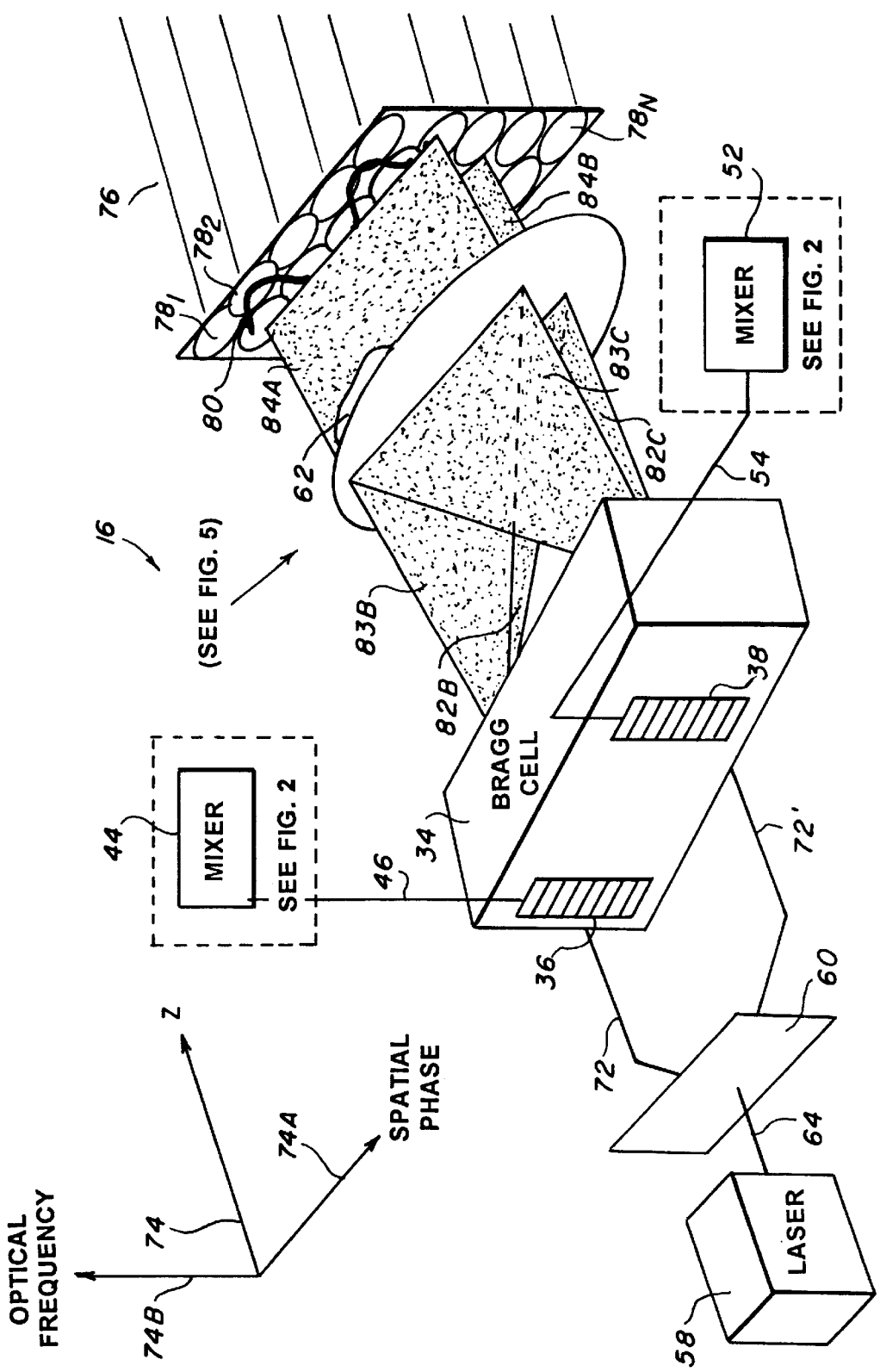
FIG. 4 is an isometric schematic of one embodiment of an optical processor of the present invention.
Figure 5:
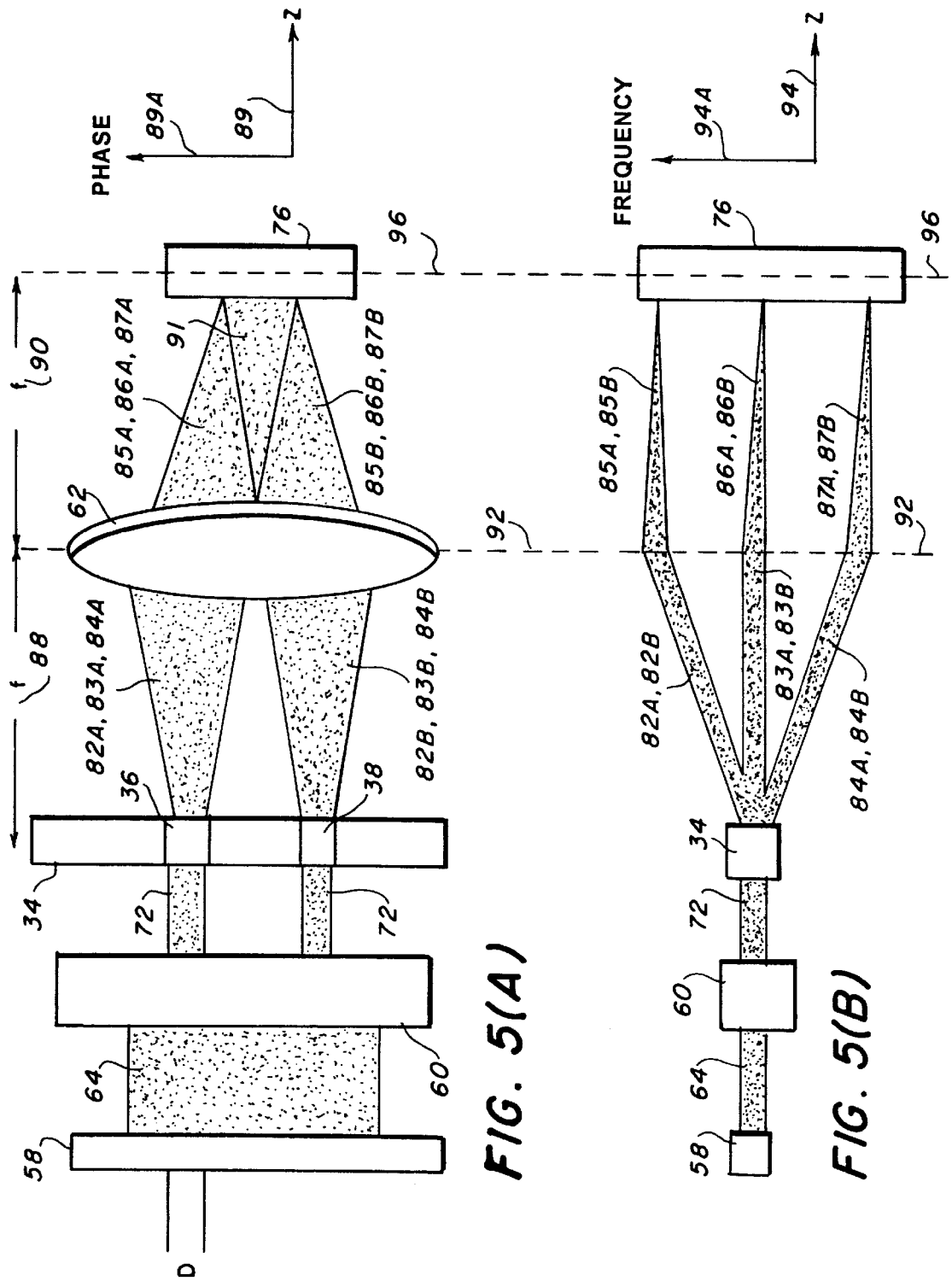
FIG. 5 is composed of FIGS. 5A and 5B respectively illustrating top and side projections related to the optical beams yielded by the embodiment of FIG. 4.

In general, the optical processor 16 of FIG. 4 measures the signal amplitude and phase of the RF signal 24 of FIG. 1 at the code repetition harmonics established by pseudorandom noise (PRN) generator 50 of FIG. 2. The optical processor 16 produces the signal Fourier transform at optical frequencies and displays the Fourier transform image at the output focal plane. Each harmonic is displayed as a spectral intensity sinusoid along a spectrally orientated light bar on the focal plane. The sinusoid amplitude varies with the coefficient modulus and the sinusoid phase varies with the coefficient phase. Thus, the optical processor 16 produces the amplitude (sinusoid amplitude) of the RF signal 24 of FIG. 1.

FIG. 4 illustrates the arrangement of some of the elements previously discussed with reference to FIGS. 2 and 3. Laser and collimator 58 outputs a collimated light beam 64 which is split into two paths at beam splitter 60. The output of beam splitter 60 produces laser beams 72 that intercept acoustic columns 36 and 38. FIG. 4 further illustrates an orientation 74 having spatial phase and optical frequency directions respectively indicated by directional arrows 74A and 74B and a z axis, and an array 76 comprised of a plurality of spaced apart optical fibers $78_1, 78_2, \ldots 78_N$. The plurality of optical fibers $78_1, 78_2, \ldots 78_N$ is arranged to cover the predetermined region of the optical output of the Fourier lens 62 at the Fourier plane 96 (to be further discussed with reference to FIG. 5). The array 76 is shown to have impressed thereon a sinusoidal pattern generally illustrated by reference number 80. The Bragg cell 34 produces beam patterns to be described with reference to FIG. 5 that intercept Fourier lens 62 which, in turn, produce beam patterns to be described with reference to FIG. 5 that intercept the array 76. The beam patterns produced by the Bragg cell 34 and Fourier lens 62, as well as the collimated laser beams 72, may be further described with reference to FIG. 5 composed of FIGS. 5(A) and 5(B).

FIG. 5(A) illustrates the beams' interaction that primarily yields phase information of the complex Fourier coefficients analyzed by the present invention, whereas FIG. 5(B) illustrates the beams' interaction that primarily yields frequency information of the complex Fourier coefficient analyzed by the present invention. FIGS. 5(A) and 5(B) are illustrated so as to show the interrelationship between beams 82A, 82B, 83A, 83B, 84A and 84B (all impinging the Fourier lens 62); and 85A, 85B, 86A, 86B, 87A and 87B (all exiting from the Fourier lens 62). The Bragg cell 34, in an operative relationship with the Fourier lens, produces a set of the beams 82A, 82B . . . 87A and 87B for each frequency of the RF signal 24 being analyzed.

The Bragg cells 36 and 38 and Fourier lens 62 are arranged so that for each frequency in the spectrum shared by the RF signal 24 and PRN generator 50 corresponds to that frequency that is deflected by the Fourier lens 62 to the same region of the photodetectors $78_1, 78_2 \ldots 78_N$ where the dispersed beams launched from the Bragg cells 36 and 38 form an interference pattern.

FIG. 5(A) illustrates the acoustic columns 36 and 38 of Bragg cell 34 respectively producing beam patterns 82A, 83A, 84A and 82B, 83B, 84B which impinges on the Fourier lens 62 which, in turn, produces beam patterns 85A, 85B, 86A, 86B, 87A, and 87B. FIG. 5(A) further illustrates an orientation 89 in which the phase direction along the Fourier plane 96 is indicated by a directional arrow 89A, whereas FIG. 5(B) illustrates an orientation 94 in which the frequency direction along the Fourier plane 96 is indicated by a directional arrow 94A. Beam patterns 85A, 85B, 86A, 86B, 87A, and 87B of FIG. 5(B) are focused in the frequency direction of the array 76. The array 76 is arranged at the Fourier plane 96 in both the phase and frequency directions. Further, FIG. 5(A) illustrates two focal lengths respectively identified by dimension lines 88 and 90 that meet at the centerline 92 of the Fourier lens 62. The Fourier lens 62 is one focal length, indicated in FIG. 5(A) by reference number 88, behind the Bragg cell, and the fiber array 76 is one focal length, indicated in FIG. 5(A) by reference number 90, behind the Fourier lens 62 for true Fourier imaging, known in the art, sometimes referred to as telecentric imaging. Although it is preferred, the Bragg cell may be located, relative to the Fourier lens 62, at lengths other than the focal length.

For both beams (such as 85A and 85B related to the signal and reference acoustic column 36 and 38, respectively,) the Fourier lens 62 images the spatially dispersed frequency components as light bars along the phase direction in the Fourier plane 96. The spatially dispersed frequency components are sometimes referred to as demultiplexed frequency components. For a given frequency, the signal and reference beams travel in parallel after the Bragg cell, the Fourier lens focuses these two beams to the same point at the Fourier planed because a property of the Fourier lens is that it focuses beams traveling in the same direction, to the same point in the Fourier plane. This causes signal and reference light bars to overlap at the Fourier plane. More particularly, the superimposed beams 85A and 85B form a light bar on the array 76 so as to create an interference pattern as previously mentioned. The acousto-optic interaction length, l, not shown in FIG. 5 but previously discussed with reference to FIG. 3, determines the frequency plane divergence $1/e^2$ width, $\delta\Theta_{freq}$, as $\delta\Theta^{freq}=\lambda/l$ where the subscript "freq" represents the frequency direction and $\lambda$ is the optical wavelength of the deflected beam. The acoustic column interaction width along the phase direction, D, shown in reference FIG. 5A, determines the phase divergence $\delta\Theta_p$, as $\delta\Theta_p=\lambda/D$, where the subscript, p, represents the phase direction 89A. Since the interaction length, l, of columns 36 and 38 of the Bragg cell 34 is usually much greater than the column width, D, thereof, each beam diverges much more along phase direction 89A than along frequency direction 94A.

The Fourier lens 62 images each signal frequency each having beams 82A, 82B . . . 87A and 87B, onto the Fourier plane 96 as a bar shaped beam 91 along the phase direction 89A and shown in FIG. 5(A) for the footprint of beam 85A intercepting and overlapping beam 85B. The light bar frequency resolution, $\delta$, varies with the deflected beam frequency divergence as $\delta=f\delta\Theta$freq where f is the Fourier lens focal length. The bar length, BL, such as that of bar shaped beam 91, varies with the deflected beam divergence along the phase direction 89A and BL=$f\delta\Theta_p$. The bar position, Y along the frequency direction 94A for both the beam signals associated with the column 36 and beam signals associated with the reference column 38, depend on the RF frequency of the signal applied on signal path 46 (see FIG. 4). For a given frequency, Y is the same for both associated beams and may be expressed:

$$Y = f\theta_B(\omega) = \frac{\lambda f \omega}{2\pi v} \quad (1)$$

where $\Theta_B(\omega)$ is the frequency dependent Bragg deflection angle and v is the acoustic velocity. At each RF frequency of the signal applied on signal path 46, all of beams associated with the signal and reference columns produce a phase directed light bar across the Fourier plane 96. The reference focal plane optical output is a regularly spaced pattern of light bars representing a frequency comb where all the frequency components are initially in a known relative phase (ideally zero phase). The comb spectrum contains frequencies at the center of each frequency channel to be further described. Representative light bars are to be further described hereinafter with reference to FIG. 14.

The split collimated beams 72 (see FIG. 5(A)) impinge on the Bragg cell 34. The split collimated beams 72 impinge upon the Bragg cell 34 optical input face, and separately illuminate acoustic columns 36 and 38. The upconverted signal waveform on signal path 46 (see FIG. 4) generates the acoustic column 36 induced weak diffraction grating that deflects the applied optical beam 72 to the Bragg cell output beams 82A, 83A, and 84A. The acoustic column 36 spatially disperses or demultiplexes the frequency within the acoustic column 36 into deflected light beams 82A, 83A, and 84A in a manner as generally shown in FIG. 5(B). The deflected beams propagate at different angles in the frequency direction 94A as shown in FIG. 5(B). Each deflected beam 82A, 83A, and 84A is modulated, in frequency and phase by the respective signal characteristics applied on signal path 46 in a manner as shown in FIG. 5(A) (phase) and FIG. 5(B) (frequency).

The reference upconverted PRN code waveform applied on signal path 54 (see FIG. 4) is transduced into the reference acoustic column 38 of the Bragg cell 34. The reference acoustic induced diffraction grating of acoustic column 38 demultiplexes the reference PRN comb spectrum carried by path 54 as deflected beams 82B, 83B, and 84B from the incident collimated beams 72. The deflected light beams propagate into frequency dependent angles in the frequency direction 94A. Each deflected beam is frequency and phase modulated by its PRN spectral component generated by the PRN generator 50 of FIG. 2. The reference beam frequency modulations are all phase synchronous.

The light bar intensity such as that developed by the superimposed beams 85A and 85B of FIG. 5(A), depends on the signal and reference channel drive powers, which, for the embodiment of FIG. 4, are the signal on signal path 46 and reference signal on reference signal path 54. The reference illumination is constant since the reference beam power (PRN generator 50) is spectrally and temporally constant (when it is pulsed on). Conversely, the signal beam intensity provided by elements 40, 42, 44 and 56 of FIG. 2 and applied on signal path 46 varies with the received signal modulation power of RF signal 24 of FIG. 1 in the spectral component. If parts of the signal and reference light bars being emitted from the Fourier lens 62 of FIG. 4 overlap, they interfere to produce a phase-directed sinusoidal spatial intensity pattern along the overlap region. If the signal and reference bars are coherent they produce a static sinusoid. Both the static sinusoid and sinusoidal spatial intensity modulation are generally illustrated in FIG. 4 by reference number 80. If the signal and reference beams being emitted from the Fourier lens 62 of FIG. 5 are not coherent, the phase of the sinusoid will drift in a manner determined by the frequency difference between the signal and reference beams. It is, therefore, important to sample the focal plane 96 interference pattern within the optical processor 16 of FIG. 4 coherence period. The modulation spatial period, Δx, is given by expression:

$$\Delta x \approx \frac{f\lambda}{d} \quad (2)$$

where d is the acoustic column separation between column 36 and 38 of the Bragg cell 34. Δx depends only on f, λ and d. Here f is the Fourier lens focal length, λ is the optical wavelength. Δx is independent of RF frequency, and is frequency independent across the frequency channels. The interference modulation depth depends on the relative intensity between the signal and reference beams. If these two intensities are equal, the modulation depth is 100%. The sinusoid phase depends on the initial signal frequency component phase of the received RF signal 24 of FIG. 1 because all the reference comb signals produced by the PRN generator 50 are synchronous.

It should now be appreciated that the optical processor 16 of FIG. 4, as well as alternate embodiments of FIGS. 9–12 to be described hereinafter, has thus analyzed the spectrum of the unknown signal, that is, RF signal 24 of FIG. 1. The optical processor 16 produces the Fourier coefficients' amplitude and phase. As will be further described, the optical processors of FIGS. 4 and 9–12, process all frequencies in parallel. The signal modulation frequency of the RF signal 24 excites channel outputs to respond with Fourier coefficient descriptors. The focal plane 96 sinusoid modulation depth indicates the signal Fourier component intensity modulation, and the sinusoid phase measures the relative phase between the signal and reference beams respectively produced by acoustic columns 36 and 38 of the Bragg cell 34. Since the signal and reference beams are in phase, the sinusoid phase gives the signal phase modulation component.

Figure 6:
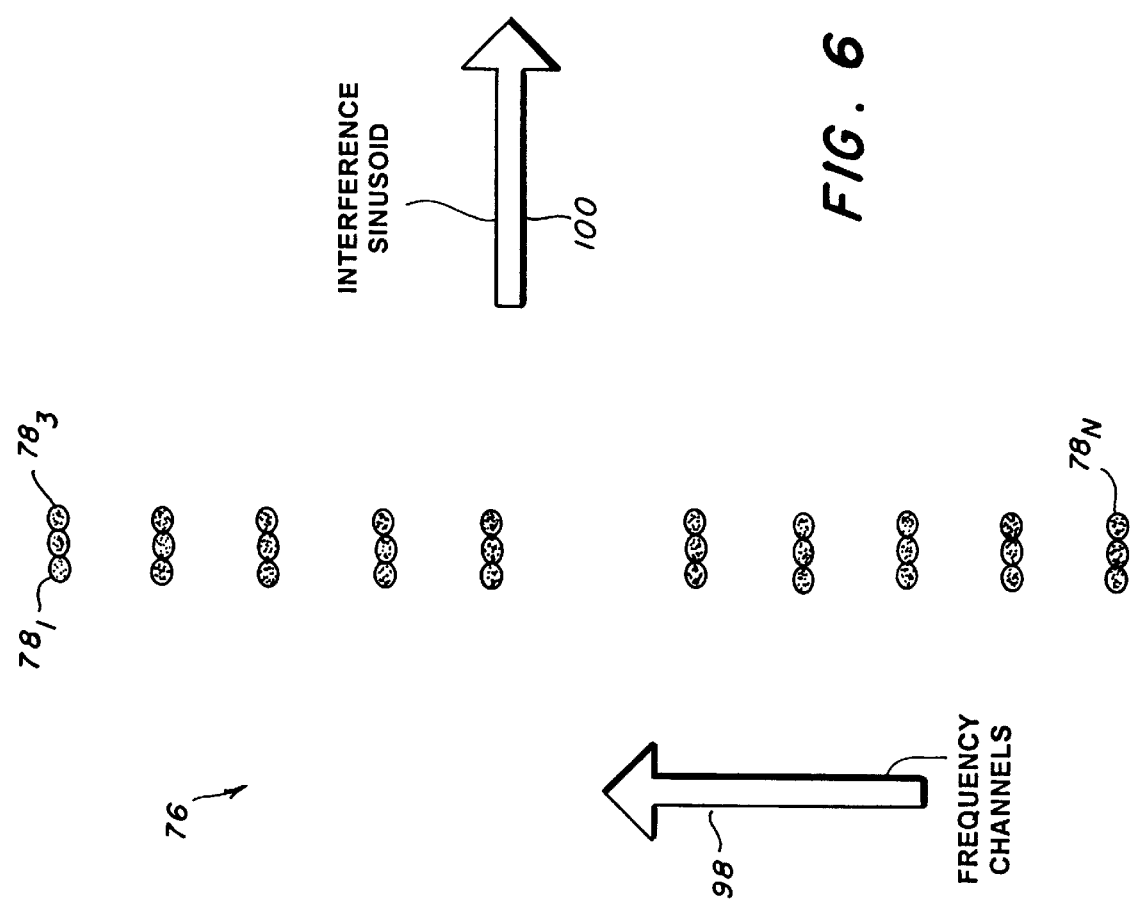
FIG. 6 is a schematic of the fiber arrangement of the array of the fiber/sensor arrangement of the optical focal plane of FIG. 4.

The fiber array 76 samples the Fourier plane 96 and may be described with reference to FIG. 6. FIG. 6 schematically illustrates the array 76 comprised of the plurality of optical fiber $78_1 \ldots 78_N$ arranged in a row-column matrix with the rows being identified by the nomenclature frequency channels indicated by directional arrow 98, and the columns being identified by the nomenclature interference sinusoid indicated by directional arrow 100 and correlatable to the sinusoidal waveform 80 shown in FIG. 4.

Each phase directed line corresponds to a different frequency channel that is spatially sampled as an interference sinusoid three times as shown by the three fiber arrangement in each row of FIG. 6. FIG. 6 also shows the fiber $78_1 \ldots 78_N$ position in the fiber array 76. Each fiber $78_1 \ldots 78_N$ addresses a separate photodetector, to be described with reference to FIG. 7, which converts the intercepted optical signal to an electrical signal. The output electronics 18 of FIG. 7 extracts this information and provides a digital pulse descriptor word therefor.

Figure 7:
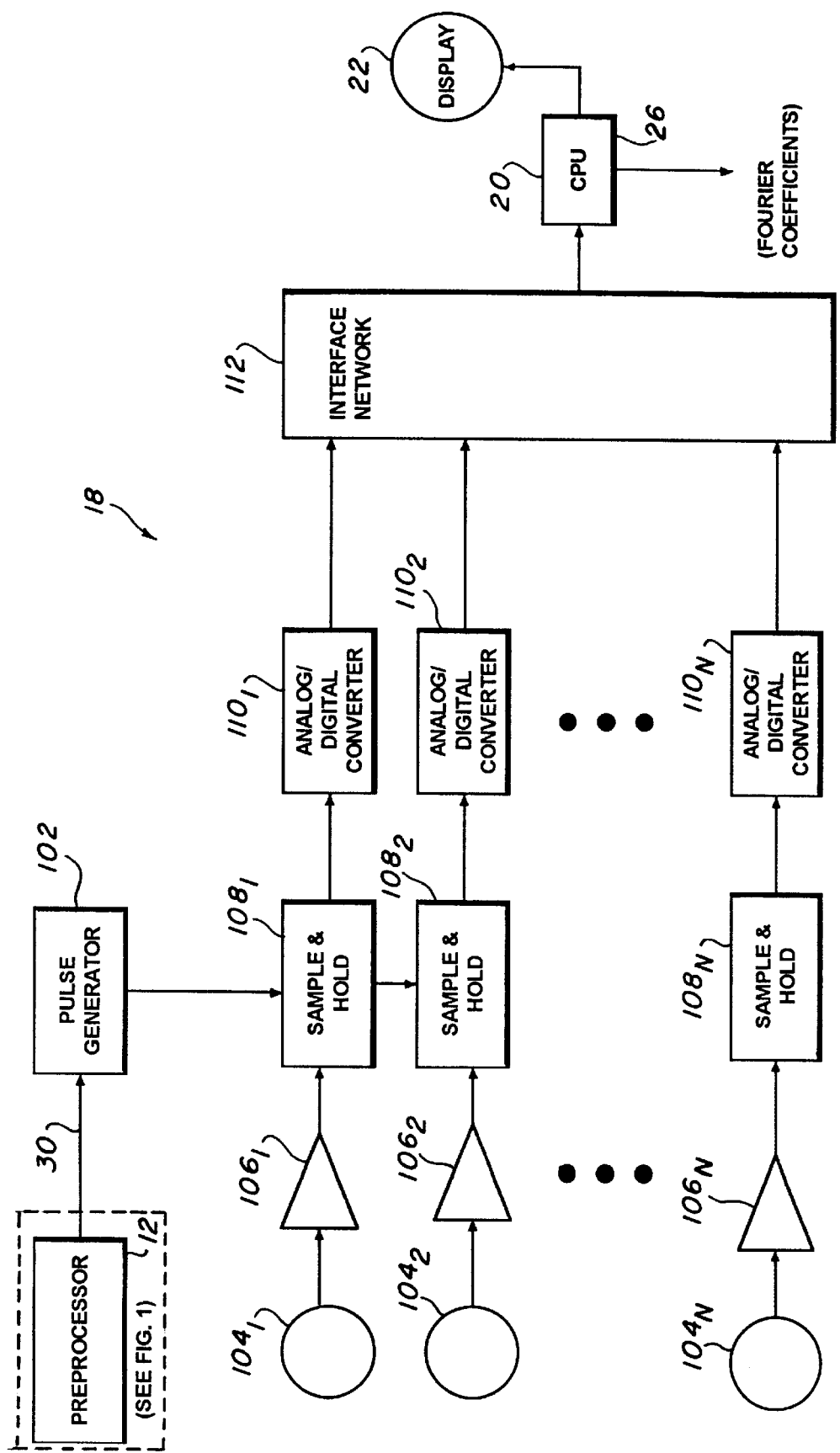
FIG. 7 is a schematic of the output electronics of FIG. 1.

FIG. 7 illustrates the output electronics 18 which provide, in part, a means for receiving the pattern of intercepted optical signals and extracting therefrom the Fourier coefficients. The output electronics 18, as shown in FIG. 7, is comprised of a plurality of elements identified in Table 1 by reference numbers and functional operations.

TABLE 1

| REFERENCE NO. | FUNCTION |
|---|---|
| 102 | PULSE GENERATOR |
| $104_1, 104_2, \ldots 104_N$ | PHOTODETECTOR |
| $106_1, 106_2, \ldots 106_N$ | TRANSIMPEDANCE AMPLIFIERS |
| $108_1, 108_2, \ldots 108_N$ | SAMPLE AND HOLD CIRCUITS |
| $110_1, 110_2, \ldots 110_N$ | ANALOG/DIGITAL CONVERTERS |
| 112 | INTERFACE NETWORK |

In general, the output electronics 18 of FIG. 7 extracts the information from the output focal plane 96 of FIG. 5, digitize the signal at points on the focal plane 96, and encode the complex Fourier coefficients thereof. The output electronics 18 spatially samples and digitizes each waveform at three points along the phase axis for each frequency (previously discussed with reference to FIG. 6). The preprocessor's 12 trigger, by way of the second timing signal, initiates the sampling of the contents of the digitized waveforms.

FIG. 7 shows the signal path 30 on which is the second timing signal generated by the preprocessor 12 of FIG. 1 is applied, as being routed to the pulse generator 102. The pulse generator 102 determines the sampling rate of the data of the output electronics 18 by appropriately activating the sample and hold circuits $108_1 \ldots 108_N$. The photodetectors $104_1 \ldots 104_N$ respectively receive the outputs of the fibers $78_1 \ldots 78_N$ and provide a corresponding electrical signal to the transimpedance amplifiers $106_1 \ldots 106_N$. The transimpedance amplifiers $106_1 \ldots 106_N$ drive the sample and hold circuits $108_1 \ldots 108_N$ which contain the spatial sinusoidal amplitude values at the sample time established by the pulse generator 102. The second timing signal on signal path 30 generated by the preprocessor 12 initiates the pulse generator 102 to establish the sample window, that is, the time duration in which the contents of the sample and hold circuits $108_1 \ldots 108_N$ are read out. Each sample and hold circuit $108_1 \ldots 108_N$ provides an output which drives a separate analog-to-digital converter $110_1 \ldots 110_N$, which, in turn, digitizes the signal from each fiber $78_1 \ldots 78_N$ shown in FIG. 4. Each analog-to-digital converter provides an output, in parallel, that is passed to the CPU 20 by way of an interface network 112, and each of these digitized signals is stored in a memory of the CPU 20. The interface network 112 provides the protocol to allow the digital signals of the A/D converters $110_1 \ldots 110_N$ to be delivered to the CPU 20 in a manner known in the art.

The digitized data provided by A/D converters $110_1 \ldots 110_N$ from each photodetector $104_1 \ldots 104_N$ is stored in a memory array of the CPU 20. Each photodetector row corresponds to a frequency channel, and each column corresponds to a periodic sample of the sinusoid (see FIG. 4 reference number 80) in a manner as described with reference to FIG. 6. The technique for the periodic sampling may be that described in U.S. Pat. No. 5,682,238, assigned to the same assignee as the present invention, and herein incorporated by reference. The presence of a sinusoid at a given frequency indicates the presence of a signal modulation at the respective channel frequency. If no signal is present, a uniform bar along the phase axis is present for that frequency. The amplitude of the sinusoid for that frequency indicates signal modulation intensity. The signal Fourier coefficients' phase is determined both by the photodetector $104_1 \ldots 104_N$ responses along the spatial sinusoid (see FIG. 4 reference number 80) and the fiber $78_1 \ldots 78_N$ spacing along the spatial sinusoid (see FIG. 4 reference number 80). If the fiber $78_1 \ldots 78_N$ samples are at points separated by 90 spatial degrees, the signal amplitude, A, and the signal phase, φ, are respectively given by expressions (3) and (4):

$$A = \sqrt{\left(\frac{D1^2 + D2^2 + D3^2}{2} - D2(D1 + D3)\right)} \quad (3)$$

$$\phi = a\tan\left(\frac{D1 - D3}{D1 + D3 - 2D2}\right) \quad (4)$$

where D1, D2 and D3 are the responses of the first, second, and third fibers along the Fourier component spatial sinusoid. More particularly, with reference to FIG. 6, the first, second and third fibers are those of any three fibers along any row identified by directional arrow 98 (frequency channels). With regard to expression (4), any quadrant ambiguity of the atan (arc tan) quantity can be resolved by considering the sign of the numerator and the denominator of expression (4).

The computer, in particular CPU 20, receives the digitized data, manipulates and assembles the Fourier coefficients' amplitudes and phases and provides them in a pulse descriptor word (known in the art). For instance, the information could be output from the A/D converters 110 by N digital words on N parallel data busses. Each parallel bus would contain the amplitude and phase corresponding to one frequency and the parallel lines could provide for parallel processing of the data, thereby, reducing the required processing time to about 16 μsec, which is a substantial decrease of the prior digital processing art that took about 300 μsec.

The application program being run in CPU 20 should take into account critical parameters which are spectral sampling width, timing, throughput rate, and amplitude and phase offset.

Figure 8:
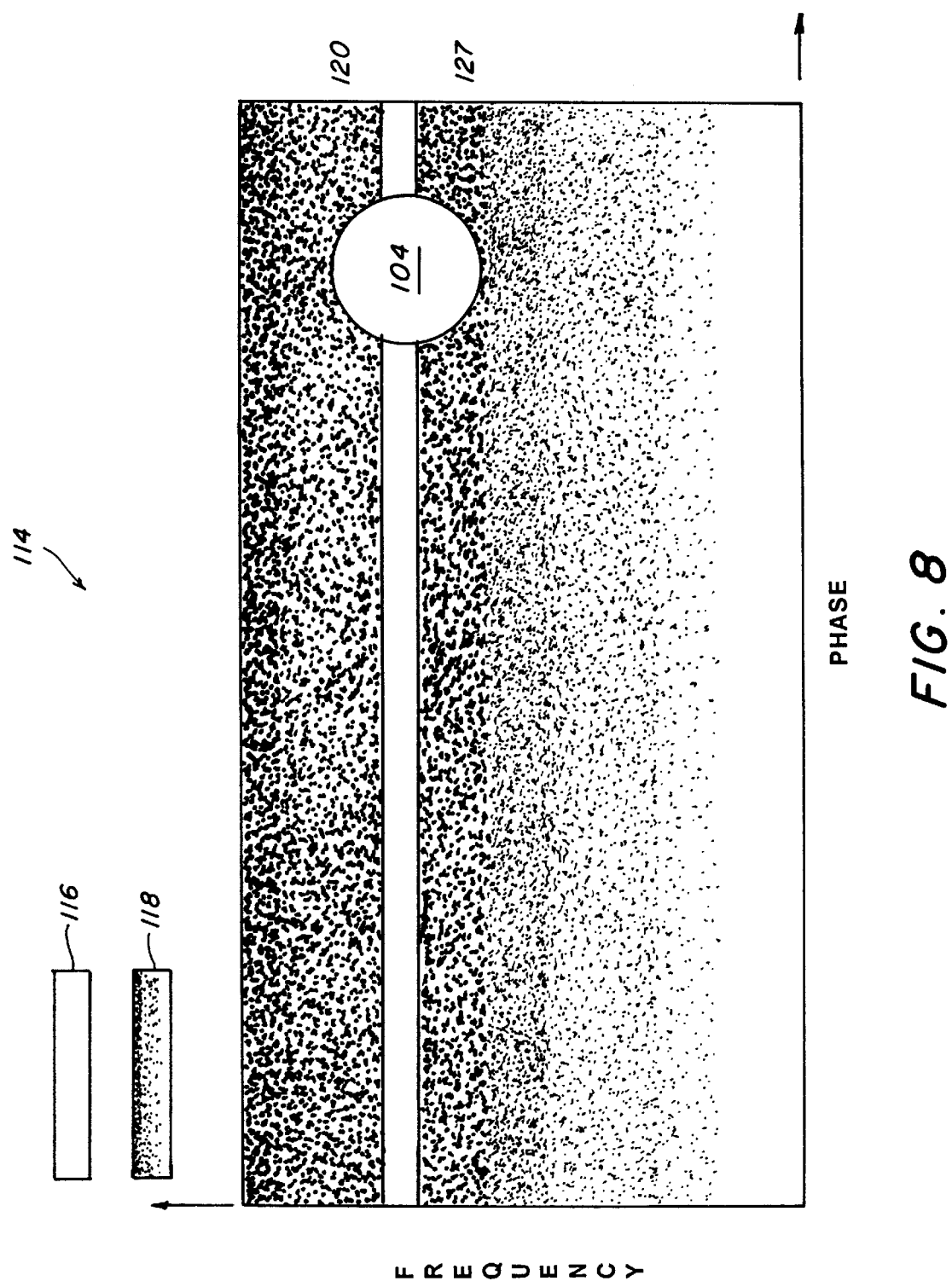
FIG. 8 is a Fourier plane schematic related to the present invention.

Spectral sampling width: The spectral sampling width (SSW) is the segment width along the frequency direction that samples the Fourier coefficient and may be further described with reference to FIG. 8 which is a Fourier plane schematic 114 (known in the art) having x and y axis respectively identified as phase and frequency parameters previously discussed with reference to FIG. 5 and illustrating the reference beam (identified by the clear presentation 116) and signal beam (identified by the dark presentation 118) at different frequencies across frequency bandwidth. The reference beam is that produced by the acoustic column 38 of the Bragg cell 34, whereas the signal beam is that produced by the acoustic column 36 of the Bragg cell 34. FIG. 8 further illustrates a detector $104_1$ width identified by dimensional lines 120 and 127.

Optical processing by the system 10 of FIG. 1 of the RF signal 24 of FIG. 1 Fourier transforms the RF signal 24 along the focal plane 96 frequency direction (see FIG. 5). It is not the Fourier transform that is of interest to the present invention, but rather the Fourier coefficients of RF signal 24, which are the Fourier transform values at harmonically related spectral positions provided by the PRN generator 50 of FIG. 2. The SSW is somewhat limited by the smaller of the Fourier plane reference light band width (e.g., clear presentation 116) or the fiber diameter of optical fibers $78_1 \ldots 78_N$ of FIG. 4.

There is a design trade-off for the selection of SSW. A wide SSW produces more power at the photodetector, such as photodetector $104_1$ of FIG. 7, but also narrows the integration time window necessary to maintain coherence between signal and reference established by pulse generator 102. The wider SSW increases the power by allowing the photodetectors $104_1 \ldots 104_N$ of FIG. 7 to accept more of the instantaneous signal spectrum developed by the RF signal 24 of FIG. 1. But the wide SSW exhibits a short term decorrelation interval that limits the coherent integration period. More particularly, the wider the frequency separation between the SSW limit (established by the acoustic column 36 of the Bragg cell 34) and the reference tone (established by the acoustic column 38 of the Bragg cell 34) at the SSW center frequency, the faster the two (signal and reference) tones decorrelate. This limit bounds the integration time and limits the input energy available in the sample and hold circuits $108_1 \ldots 108_N$. On the other hand, a narrow SSW provides little signal power at the Fourier component and less coherence loss. The narrow SSW allows longer sinusoid sampling. More particularly, the narrow SSW allows for more time to sample the three fibers previously described with reference to FIG. 6. The trade-off is between a wide spectral sampling width (SSW) which provides more power for a limited sampling time and a narrow spectral sampling width (SSW) which provides little power and a long integration time.

Timing: Precise timing is critical to both the input and output electronics of FIGS. 2 and 7 respectively. For the input electronics 14, the waveforms in the signal and reference Bragg cells are synchronized, otherwise the phase of the measured sinusoids, generally illustrated in FIG. 4 with reference number 80, are not consistently produced. The total reference waveform (such as beam 85B of FIG. 5(A)) is applied at the focal plane 96 before the signal waveform (such as beam 85A of FIG. 5(A)). The complete reference waveform (such as beam 85B of FIG. 5(A)) remains at the focal plane 96 until the signal (such as beam 85A of FIG. 5(A)) is completely transferred through the optical processor 16 to ensure a spatial sinusoid (represented by the sinusoidal 80 of FIG. 4) for the entire sample time. In the output electronics 18, the sampling begins after the signal waveform enters the signal Bragg cell acoustic column 36. More particularly, with reference to FIG. 4, the sampling begins after the signal produced by mixer 44 (also see FIG. 2) is applied on signal path 46 (see FIG. 4). The preprocessor 12 trigger signals on signal paths 28 and 30 of FIG. 1 initiates timing for both the PRN code of the PRN generator 50 of FIG. 2 and the sampling of FIG. 7. Inserting appropriate delay lines, such as time delay 42 of FIG. 2, assures proper synchronization between the input (14) and output (18) electronics.

Throughput rate: Because of speed-of-light processing, the spectrum related to the RF signal 24 of FIG. 1 appears at the focal plane 96 of FIG. 4 substantially instantly. The focal plane 96 information quickly flows through the fibers $78_1 \ldots 78_N$, detectors $104_1 \ldots 104_N$ and transimpedance amplifiers $106_1 \ldots 106_N$ of FIG. 7. The first sample function τ, of each waveform is integrated and digitized in an equivalent amount of time. The digitized information at the output of the A/D converters $110_1 \ldots 110_N$ of FIG. 7 then flows to the computer (CPU 20) where it takes up to 16 microseconds (previously discussed parallel processing) to compute the spectrum and encode it.

Amplitude, Phase and Bias Offsets: Three measurements are needed to solve for the three unknowns: amplitude, phase and bias offsets. In the process of calculating phase coefficients, the computation of an arc tangent function is needed. Since this would take several microseconds in software an arctan look-up table is used.

It should now be appreciated that the present invention comprises an electronic/optical hybrid system 10 that provides complex spectrum analysis that builds on Bragg cell spectrum analysis technology. The phase values obtained by the practice of the present invention are determined by referencing the spectrum lines to a phase matched set of local oscillators, that is, oscillator 56 of FIG. 2. To accomplish this, phase matched local oscillators are provided from a PRN generator 50 initialized by the leading edge of the signal.

It should also be appreciated that the practice of the present invention provides a technique that is electronically synchronized to and triggered by the leading edge of the unknown RF signal 24 of FIG. 1.

Further, it should be appreciated that the present invention generates the complex Fourier coefficients with a higher throughput rate than existing technologies and, in one embodiment, also uses a fiber array to sample a signal waveform.

In addition, it should be appreciated that the present invention in its analysis aspect uses concurrent measurements of multiple Fourier coefficients to, thereby, expedite and speed up the solution in a parallel processing manner.

Furthermore, it should be appreciated that the present invention extracts the complex Fourier coefficients. A large number of complex Fourier coefficients can be measured by the present invention with minimum processing time due to parallel signal processing.

Moreover, it should be recognized that, in certain cases, the required amount of sampling of the quantities related to the invention may be reduced. For example, if the intensity of the reference signal (column 38) of the Bragg cell 34 is known and the intensity of the signal (column 36) of the Bragg cell 34 is also known, then one may calculate amplitude and offset quantities without sampling thereof. In this case, only the phase needs to be measured and can be done so with two samples at each frequency. Without this known information (intensity), at least three samplings of the related quantities are needed.

Although the present invention preferably mixes the reference signal (output of the acoustic column 38 of Bragg cell 34) optically with the channelized signal (output of the acoustic column 36 of the Bragg cell 34) component (see FIG. 7) as described with reference to FIGS. 4 and 7, it should be recognized that the practice of the present invention envisions that the mixing of the reference signal with the channelized signal can be electronically accomplished.

Figure 9:
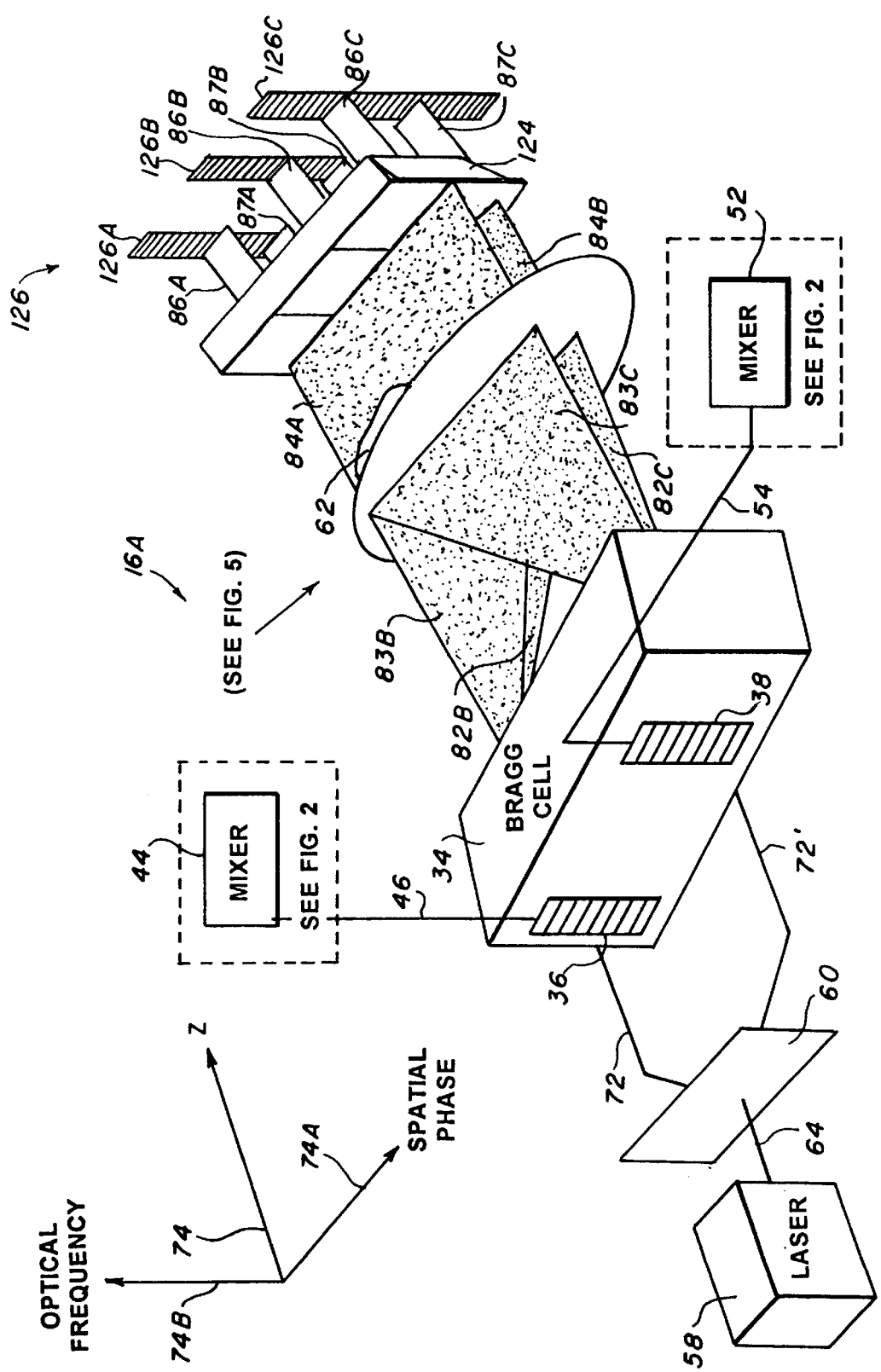
FIG. 9 is an alternate embodiment of an optical processor related to the present invention.

FIG. 9 illustrates an alternate embodiment 16A of the optical processor of the present invention. The alternate embodiment 16A is quite similar to the optical processor 16 of FIG. 4, except that beam splitter 124 has been added and at least a three row arrangement 126 comprised of photodetector elements replaces the fiber optic $78_1 \ldots 78_N$ FIG. 4. A beamsplitter 124 divides the intercepted output of the Fourier lens 62 into at least three components and provides outputs thereof that are directed to the three row column arrangement 126. The three components are phase displaced by a preferred amount of 90° in a manner previously discussed with reference to expressions (3) and (4) and the sampling thereof yields the needed information to determine the complex Fourier coefficients.

The row column arrangement 126 comprises at least three row columns 126A, 126B and 126C of photodetector elements, such as $104_1 \ldots 104_N$ of FIG. 7. A review of FIG. 9 reveals that beamsplitter 124 generates three sets of beams, 86A–87A; 86B–87B; and 86C–87C that respectively impinge columns 126A, 126B and 126C. The photodetector elements 126A, 126B and 126C are arranged respectively to receive the at least three output components of the beam splitter 124 and provides corresponding electrical output signals that represent the pattern of the intercepted focussed and combined optical output of the Fourier lens 62 which are processed in a manner as previously described with reference to FIG. 7.

Figure 10:
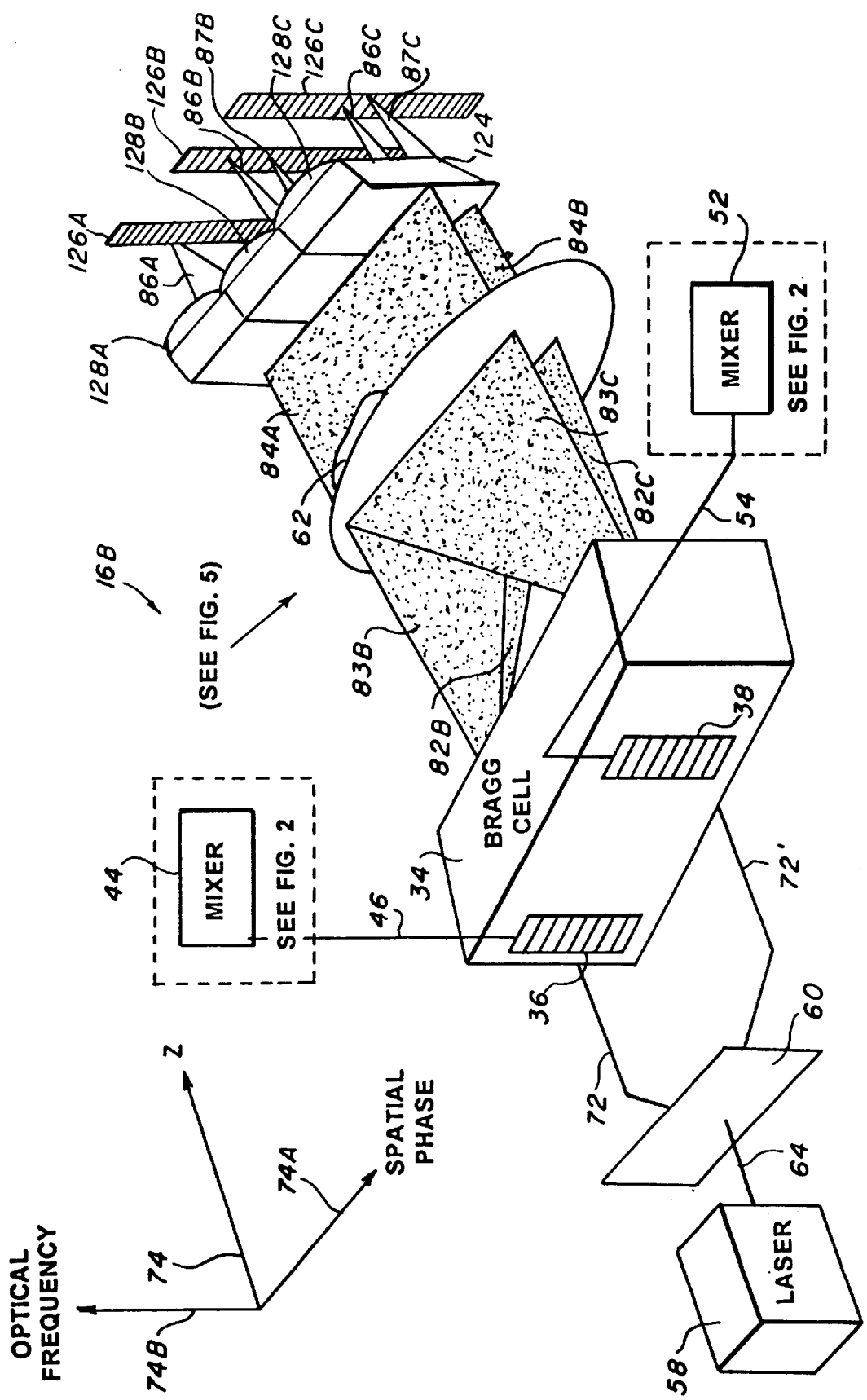
FIG. 10 is another alternate embodiment of the optical processor related to the present invention.

FIG. 10 illustrates another alternate embodiment of an optical processor 16B which is quite similar to the optical processor 16 of FIG. 4 with the exception of the addition of the beam splitter 124, previously discussed with reference to FIG. 9, and the linear detector array 126 also discussed with reference to FIG. 9, but in addition thereto, optical processor 16B comprises lenses 128A, 128B, and 128C. A review of FIG. 10 reveals that beam splitter 124, in operative cooperation with the lenses 128A, 128B and 128C, generates three sets of collimated focus beams, 86A–87A (not shown); 86B–87B; and 86C–87C that respectively impinge columns 126A, 126B and 126C each comprised of photodetector elements that provide electrical signals that are processed in a manner as described for FIG. 9. In each linear array (126A, 126B or 126C), one detector corresponds to one frequency component.

Figure 11:
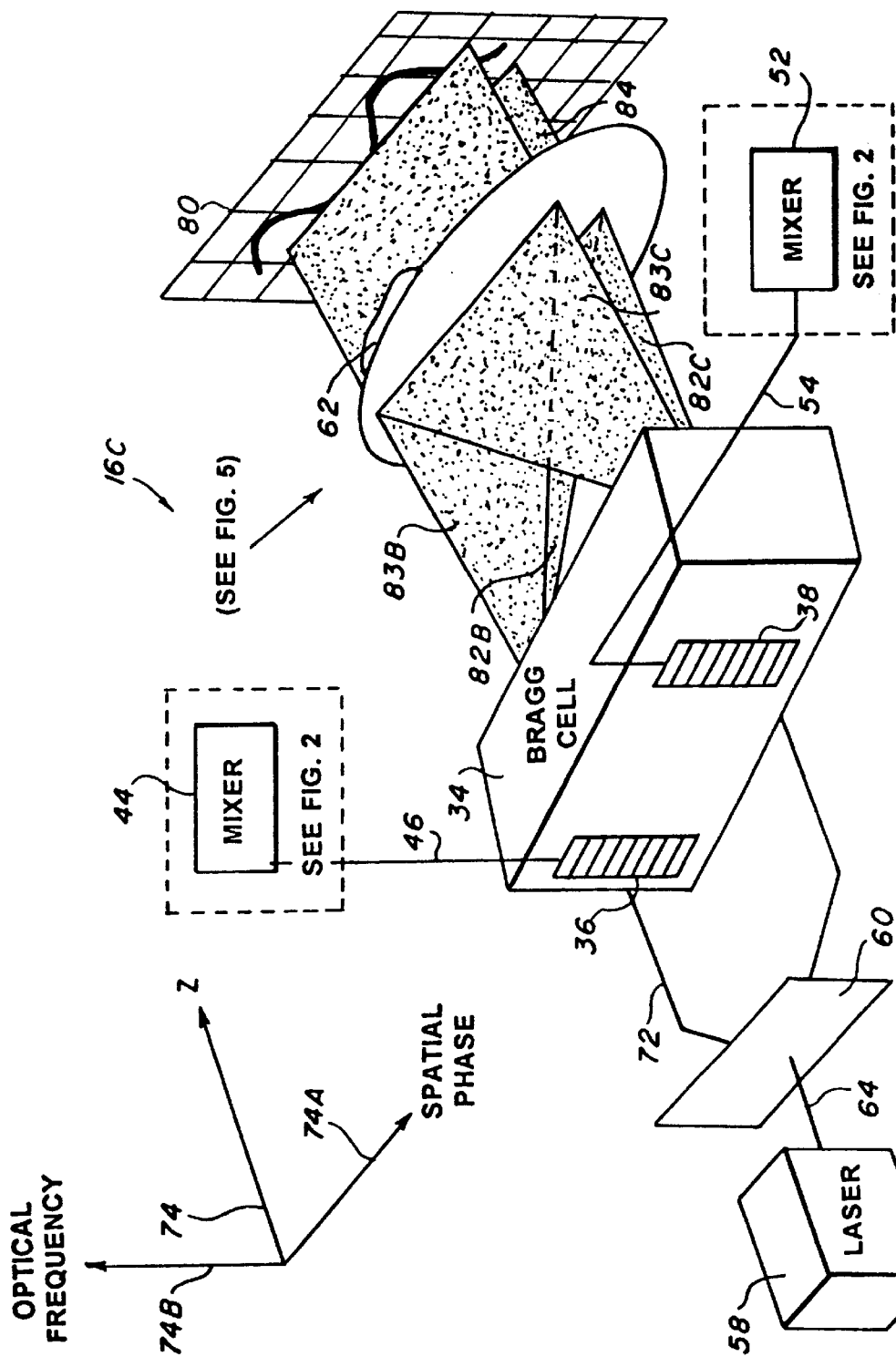
FIG. 11 is a still further alternate embodiment of the optical processor related to the present invention.

FIG. 11 illustrates a still further embodiment 16C of an optical processor related to the present invention which is quite similar to the optical processor 16 of FIG. 4 with the exception that the fiber optics $78_1 \ldots 78_N$ have been replaced by a row-column arrangement 132 of photodetectors arranged to cover a predetermined region of the optical output of the Fourier lens 62 and provide corresponding electrical outputs that represent the pattern of the intercepted optical signals. The electrical signals are routed to the sample and hold circuits $108_1 \ldots 108_N$ of FIG. 7 for further processing thereof in a manner as previously described.

Figure 12:
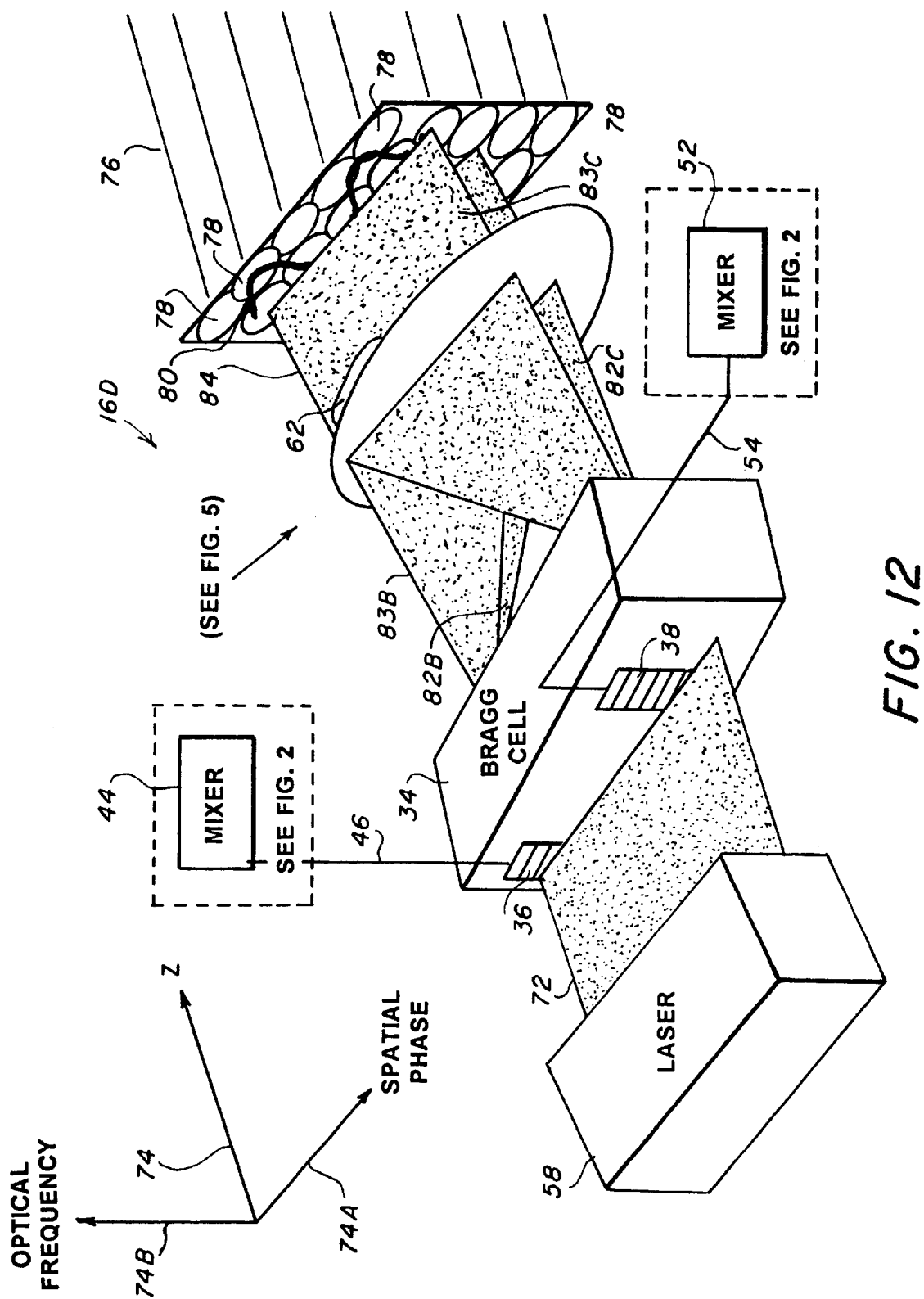
FIG. 12 is a further alternate embodiment of the optical processor related to the present invention.

FIG. 12 illustrates a still further embodiment of an optical processor 16D which is quite similar to the optical processor 16 of FIG. 4 with the exception that the beam splitter 60 is removed and laser 58 produces a beam 72 that overlaps and floods both acoustic columns 36 and 38 of the Bragg cell 34. The removal of the beam splitter 60 from the embodiments of FIGS. 4, 9, 10 and 11 may also be accomplished in accordance with the practice of the present invention.

Although the embodiments of FIGS. 9, 10, 11 and 12 have been used to separate the focal plane 96 along the phase direction, it is contemplated that other graphic techniques may also be used. Further, it is contemplated that holographic, diffractive or other types of optical elements may be used to form two separate beams to illuminate the Bragg cell 34, in particular its acoustic columns 36 and 38 of FIG. 4. Further, it is contemplated that the sampling of the array, such as that described with reference to FIG. 7, may be accomplished at any period or nonperiodic spacing. Further, it is contemplated that the sampling may be accomplished by a number M of fiber optics $78_1 \ldots 78_N$ or equivalent optical detectors rather than the three samples along the spatial sinusoidal distribution described with reference to FIG. 6.

Furthermore, it is contemplated that the sampling of the Fourier plane 96 may be accomplished by a single translated detector rather than an array. Moreover, it is contemplated that the hereinbefore given description of the phase and frequency directions 89A and 94A, respectively, discussed with reference to FIG. 5 may be reversed or the optical processor may be oriented at a random angle. In addition, it is anticipated that the separation of the Fourier lens and fiber array or the Bragg cell 34 all described with reference to FIG. 5 may be at any random distance other than those described with reference to FIG. 5(A) that provide for telecentric imaging.

In addition, it is contemplated that the present invention may be practiced with or without a beam splitter interposed between the laser and the Bragg cell.

Moreover, it is contemplated that software may be provided to compensate for unequal reference power or unequal distribution of the fibers or inadequacies of the fiber detectors responses. The reference power or photodetector response may be held constant as a function of frequency or spatial wavelength position. Furthermore, software may be used to correct for inherent phase or amplitude differences in the digital information of the analog-to-digital converters $110_1 \ldots 110_N$ of FIG. 7.

It is further contemplated that an additional pseudorandom PRN generator column frequency or PRN clock may be used as a reference to calibrate for phase differences.

Figure 13:
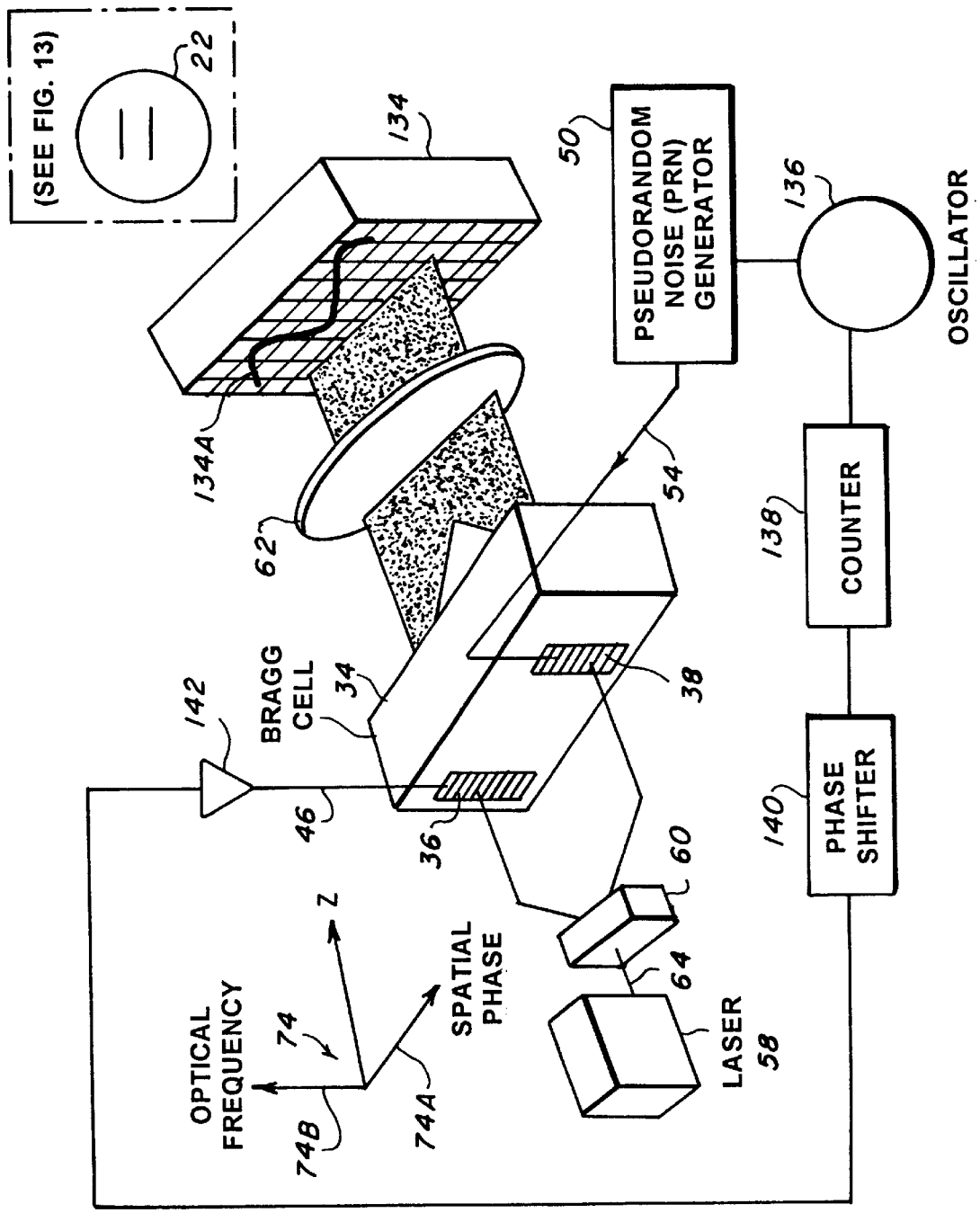
FIG. 13 illustrates a test set-up in accordance with the practice of the present invention.

In the practice of this invention tests were performed using the circuit arrangement of FIG. 13. FIG. 13 illustrates an arrangement that includes a video camera 134. The video camera 134 houses a photodetector array, preferably a CCD array, that detected the optical sinusoidal shown thereon as 134A. A video monitor 22 may be used to display the video camera 134 output.

The arrangement of FIG. 13 utilized an 80 MHz clock oscillator 136 which drove the PRN generator 50 previously discussed with reference to FIG. 2. The PRN generator 50 produced a PRN code with a spectrum comb: 5, 10 ... 40 MHz. For the arrangement of FIG. 13 instead of an unknown signal, such as RF signal 24 of FIG. 1, the 80 MHz clock provided by oscillator 136 was routed to a counter 138 which counted down the 80 MHz clock to 20 MHz. Both the reference PRN waveform generated by the PRN generator 50 and the 20 MHz waveform generated by the counter 138 were upconverted by 2.5 GHz by the local oscillator 56 (not shown in FIG. 13 but shown in FIG. 2) to the Bragg cell 34 bandwidth. The reference PRN comb was applied directly to the reference Bragg cell acoustic column 38. The upconverted 20 MHz signal was directed to a phase shifter 140 and then to the signal Bragg cell acoustic column 36 by way of a standard amplifier 142. The results were displayed on the display 22 which may be further described with reference to FIG. 14.

Figure 14:
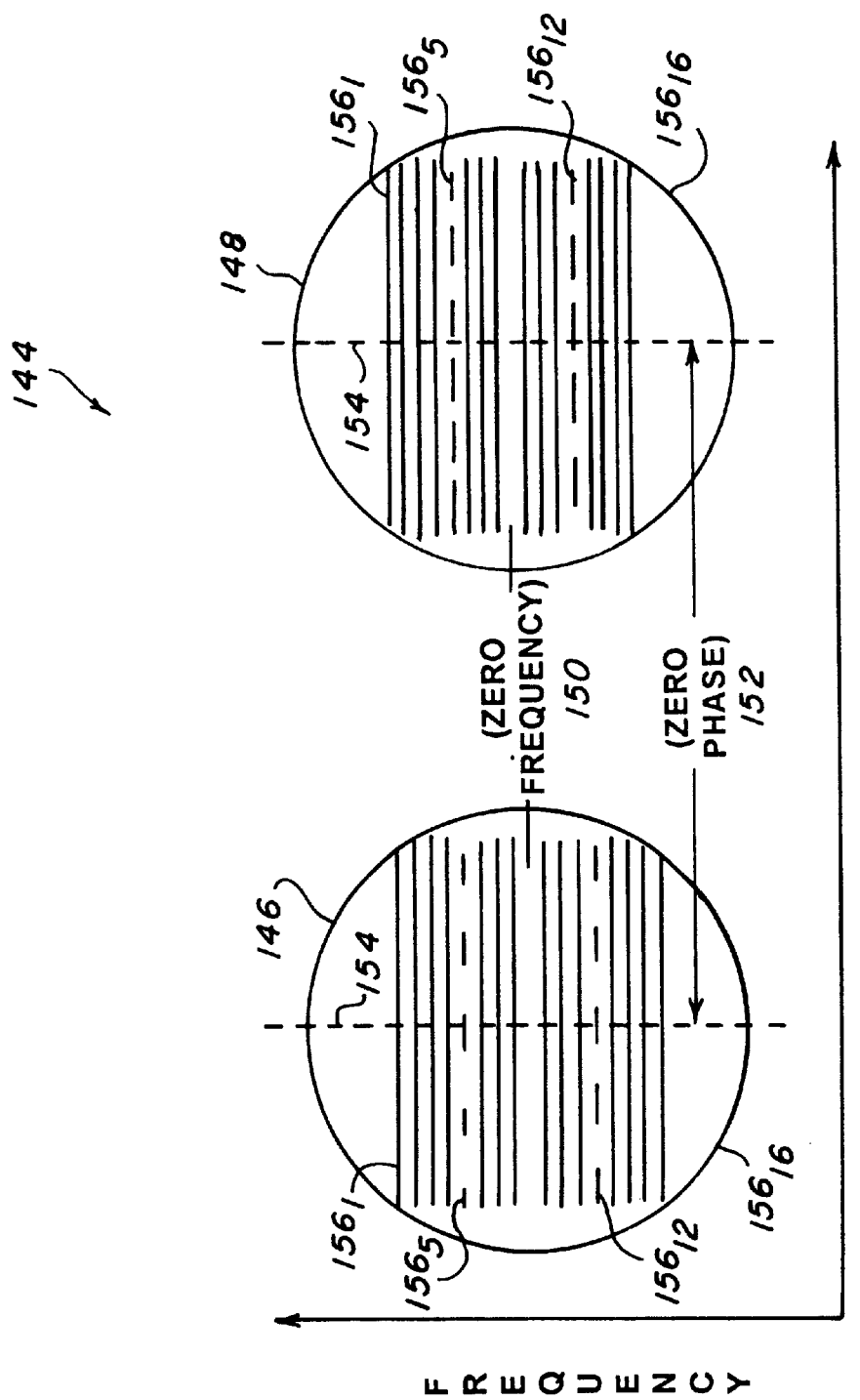
FIG. 14 schematically illustrates video monitoring displays yielded by the arrangement of FIG. 13.

FIG. 14 illustrates an overall monitor display 144 comprised of displays 146 and 148. Each of the displays 146 and 148 has a zero frequency 150, a zero phase 152 identified by dimensional lines 154 all shown in FIG. 13. FIG. 14 illustrates phase and frequency coordinates that correspond to the phase and frequency parameters of the Fourier coefficients of the signal being analyzed.

FIG. 14 schematically shows the observed video monitor displays 146 and 148 for the initial, zero phase conditions and a phase shifted condition respectively. Each of the displays 146 and 148 shows 16 lines $156_1 \ldots 156_{16}$ across the screen. These lines correspond to the light bars previously described with reference to FIG. 5. The lines $156_1 \ldots 156_{16}$ correspond to the upconverted and downconverted reference comb spectra modulated into the 2.5 GHz Bragg cell drive signal with the upconverted and downconverted frequency being respectively above and below the zero frequency 150. From FIG. 14 it should be noted that there is no line in the center (150) since this spatial signal corresponds to the carrier frequency which does not exist in double side-band conversion. The dash lines $156_5$ and $156_{12}$ at +/−20 MHz, are the observed 20 MHz optical sinusoids. These sinusoids are the interference patterns, such as 80 of FIG. 4, created by the 20 MHz comb line (generated by the PRN generator 50) and the 20 MHz signal (generated by the counter 138). Two dashed lines representing sinusoids are shown in display 146 and display 148 because both signals are upconverted to the 2,500 MHz processor center frequency. From FIG. 14 it should be noted that the display 146 shows the initial optical sinusoid, whereas the display 148 shows the optical sinusoidal after a phase shift. The shift is indicated by the dash line 154 of display 148 being positioned differently with respect to dotted line 154 in displays 146 and 148.

It should now be appreciated that the practice of the present invention provides for a system 10 that extracts the Fourier coefficients from the applied RF signal 24 in a rapid manner, such as less than 16 microseconds and allows for rapid identification and classification of the RF signal 24.

It is understood that the invention is not limited to the specific embodiments herein illustrated and described but may be otherwise without departing in the spirit and scope of the invention.

What we claim is:

1. An apparatus for extracting complex Fourier coefficients from an RF signal of interest so as to characterize said RF signal, said RF signal having a leading edge and modulation, said extracting apparatus comprising:
   (a) receiving means for receiving said RF signal and generating first and second timing signals in response to said leading edge of said RF signal, said receiving means downconverting and demodulating said RF signal to a baseband so as to remove a carrier frequency but leaving a modulation voltage, said downconverted, demodulated RF signal serving as an output of said receiving means;
   (b) means for generating a signal of interest and a reference signal for a two acoustic column Bragg cell device, said signal of interest and reference signal generating means receiving said downconverted, demodulated RF signal and said first timing signal, said signal of interest and reference signal generating means including a local oscillator;
   (c) an optical processor comprising said Bragg cell, a laser, a Fourier lens, and an array of spatially positioned means each responsive to intercepted optical signals to correspondingly produce n electrical signals that represent a pattern of said intercepted optical signals, said Bragg cell having first and second acoustic columns respectively connected to said signal of interest and reference signal of said signal of interest and reference signal generating means; and
   (d) means for receiving said pattern of said intercepted optical signals and extracting therefrom said complex Fourier coefficients.

2. The apparatus according to claim 1, wherein said optical processor includes an arrangement comprising:
   (i) said laser generating a coherent light beam;
   (ii) said first and second acoustic columns of the Bragg cell each being arranged to intercept said laser beam and providing respective optical outputs;
   (iii) said Fourier lens being arranged to intercept both of said optical outputs of said Bragg cell and providing corresponding optical outputs; and
   (iv) said means responsive to optical signals of said Fourier lens and being arranged to intercept said optical outputs of said Fourier lens and providing corresponding electrical output signals that represent a pattern of said optical outputs of said Fourier lens.

3. The apparatus according to claim 2 further comprising a beam splitter interposed between said laser and said first and second columns of said Bragg cell.

4. The apparatus for extracting complex Fourier coefficients according to claim 1, wherein said extracting means comprises:

(i) means for sampling and holding and separately receiving each of said electrical output signals, each of said sampling and holding means being connected and responsive to said second timing signal and providing an electrical analog output in response to the presence of said second timing signal, (ii) analog-to-digital (A/D) conversion means for separately receiving the output of each of said sampling and holding means and correspondingly providing a digital signal thereof; and (iii) means for examining the digital signals provided by said A/D conversion means and determining the complex Fourier coefficients contained therein including frequency and phase parameters.

5. The apparatus for extracting complex Fourier coefficients according to claim 2, wherein said optical outputs of said Fourier lens covers a predetermined region and wherein said means responsive to optical signals and arranged to intercept said output of said Fourier lens comprises:

(i) a plurality of optical fibers arranged to cover said predetermined region of said optical output of said Fourier lens; and (ii) a plurality of detector amplifier combinations arranged in correspondence with said plurality of optical fibers and providing said corresponding electrical output signals that represent said pattern of said optical outputs.

6. The apparatus for extracting complex Fourier coefficients according to claim 2, wherein said means responsive to optical signals and arranged to intercept said output of said Fourier lens comprises:

(i) a beam splitter for dividing said intercepted optical outputs of said Fourier lens into at least three components and providing outputs thereof; and (ii) at least three column arrangements of photodetector elements arranged to respectively receive said at least three output components of said beam splitter and provide corresponding electrical output signals that represent said pattern of said optical outputs of said Fourier lens.

7. The apparatus for extracting complex Fourier coefficients according to claim 6, further comprising at least three lenslets interposed between said beam splitter and said at least three column arrangements and respectively arranged to intercept optical signals of said at least three output components of said beam splitter.

8. The apparatus for extracting complex Fourier coefficients according to claim 2, wherein said optical outputs of said Fourier lens covers a predetermined region and said means responsive to optical signals and arranged to intercept said output of said Fourier lens comprises:

(i) a row-column arrangement of photodetectors arranged to cover said predetermined region of said optical output of said Fourier lens and providing said corresponding electrical output signals that represent said pattern of said intercepted optical output of said Fourier lens.

9. An apparatus for extracting complex Fourier coefficients from an RF signal of interest so as to characterize said RF signal, said RF signal having a leading edge and modulation, said extracting apparatus comprising:

(a) receiving means for receiving said RF signal and generating first and second timing signals in response to said leading edge of said RF signal, said receiving means downconverting and demodulating said RF signal to a baseband so as to remove a carrier frequency but leaving a modulation voltage, said downconverted, demodulated RF signal serving as an output of said receiving means;

(b) means for generating a signal of interest and a reference signal for a two acoustic column Bragg cell device, said signal of interest and reference signal generating means receiving said downconverted, demodulated RF signal and said first timing signal;

(c) an optical processor comprising said Bragg cell, a laser, a Fourier lens, and an array of spatially positioned means each responsive to intercepted optical signals to correspondingly produce n electrical signals that represent a pattern of said intercepted optical signals, said Bragg cell having first and second acoustic columns respectively connected to said signal of interest and reference signal of said signal of interest and reference signal generating means; and (d) means for receiving said pattern of said intercepted optical signals and extracting therefrom said complex Fourier coefficients; wherein said means for generating said signal of interest and said reference signal comprises first, second and third branches which, in turn, respectively comprise:

(i) said first branch comprising means for receiving said downconverted, demodulated RF signal, means for delaying said received downconverted, demodulated RF signal by a predetermined amount, a mixer having first and second inputs and an output with the first input receiving said delayed downconverted, demodulated RF signal and with said output providing said signal of interest of said Bragg cell device;

(ii) said second branch comprising an oscillator with an output and pseudorandom noise (PRN) generator with an output, said oscillator and said pseudorandom noise (PRN) generator both being activated in response to said first timing signal and with said output of said oscillator being applied to said pseudorandom noise (PRN) generator which is responsive thereto, said second branch further comprising a mixer having first and second inputs and an output with the first input receiving said output of said pseudorandom noise (PRN) generator and said output of said mixer providing said reference signal of said Bragg cell device; and (iii) said third branch comprising a local oscillator having first and second outputs with said first output connected to said second input of said mixer of said first branch and said second output connected to said second input of said mixer of said second branch.

10. The apparatus for extracting complex Fourier coefficients according to claim 9, wherein said pseudorandom noise (PRN) generator provides output whose Fourier series is at evenly spaced intervals representative of a comb spectrum.

11. The apparatus for extracting complex Fourier coefficients according to claim 10, wherein said pseudorandom noise (PRN) generator provides a signal whose Fourier series is a spectral comb: 5, 10 . . . 40 MHz.

* * * * *